(12) United States Patent
Chen

(10) Patent No.: US 11,785,869 B2
(45) Date of Patent: Oct. 10, 2023

(54) MEMORY DEVICE AND METHOD OF MANUFACTURING THE SAME

(71) Applicant: Winbond Electronics Corp., Taichung (TW)

(72) Inventor: Frederick Chen, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 309 days.

(21) Appl. No.: 17/344,963

(22) Filed: Jun. 11, 2021

(65) Prior Publication Data

US 2022/0399490 A1 Dec. 15, 2022

(51) Int. Cl.
*H10N 70/00* (2023.01)
*H10B 63/00* (2023.01)

(52) U.S. Cl.
CPC ....... *H10N 70/8265* (2023.02); *H10B 63/845* (2023.02); *H10N 70/011* (2023.02)

(58) Field of Classification Search
CPC .. H10N 70/8265; H10N 70/011; H10N 70/20; H10N 70/823; H10B 63/845; H10B 63/30
See application file for complete search history.

(56) References Cited

U.S. PATENT DOCUMENTS

| | | | |
|---|---|---|---|
| 5,210,047 A | 5/1993 | Woo et al. | |
| 7,741,630 B2 | 6/2010 | Ufert et al. | |
| 9,673,102 B2 | 6/2017 | Liu et al. | |
| 9,842,651 B2 | 12/2017 | Harari | |
| 9,892,800 B2 | 2/2018 | Harari | |
| 11,476,276 B2 * | 10/2022 | Lee | H01L 23/5226 |
| 11,508,741 B2 * | 11/2022 | Han | H10B 63/845 |
| 2008/0203469 A1 | 8/2008 | Gruening-von Schwerin | |
| 2019/0198569 A1 | 6/2019 | Hsu | |
| 2021/0375938 A1 * | 12/2021 | Lin | H10B 51/20 |
| 2023/0045495 A1 * | 2/2023 | Lee | H10N 70/066 |

FOREIGN PATENT DOCUMENTS

| | | |
|---|---|---|
| CN | 104124257 | 10/2014 |
| CN | 111863829 | 10/2020 |
| TW | 201034169 | 9/2010 |
| TW | 202111925 | 3/2021 |

OTHER PUBLICATIONS

"Office Action of Taiwan Counterpart Application", dated Feb. 22, 2022, p. 1-p. 5.

* cited by examiner

*Primary Examiner* — Allison Bernstein
(74) *Attorney, Agent, or Firm* — JCIPRNET

(57) ABSTRACT

Provided is a memory device including a stack structure, a plurality of channel layers, a source line, a bit line, a switching layer, and a dielectric pillar. The stack structure has a plurality of dielectric layers and a plurality of conductive layers stacked alternately. The channel layers are respectively embedded in the conductive layers. The source line penetrates through the stack structure to be electrically connected to the channel layers at first sides of the channel layers. The bit line penetrates through the stack structure to be coupled to the channel layers at second sides of the channel layers. The switching layer wraps the bit line to contact the channel layers at the second sides of the channel layers. The dielectric pillar penetrates through the channel layers to divide each channel layer into a doughnut shape. A method of manufacturing a memory device is also provided.

20 Claims, 21 Drawing Sheets

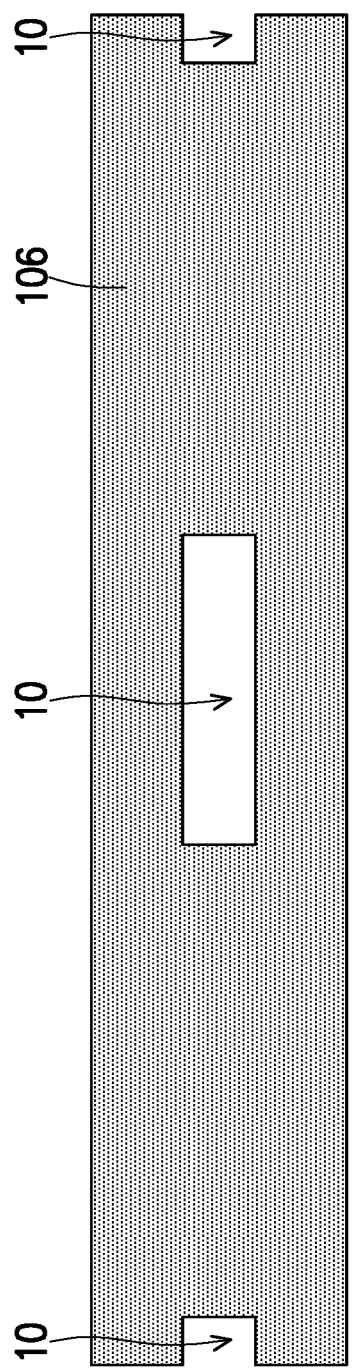
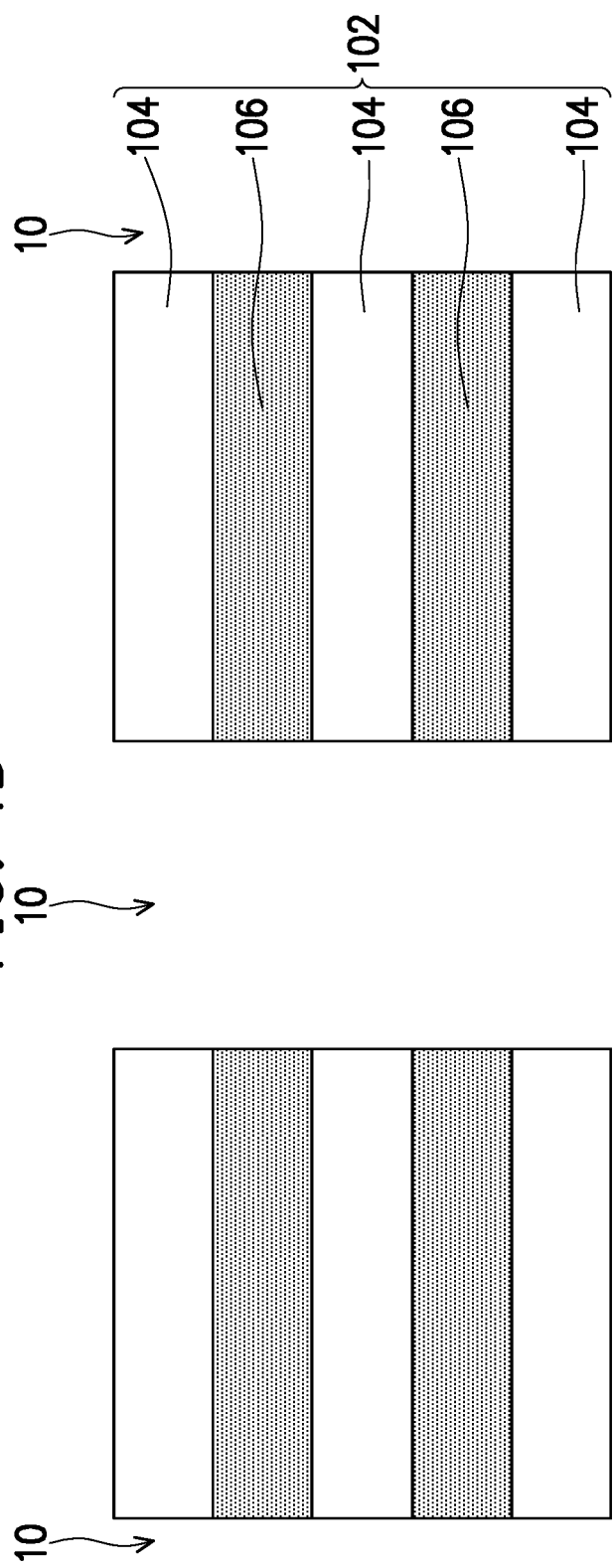

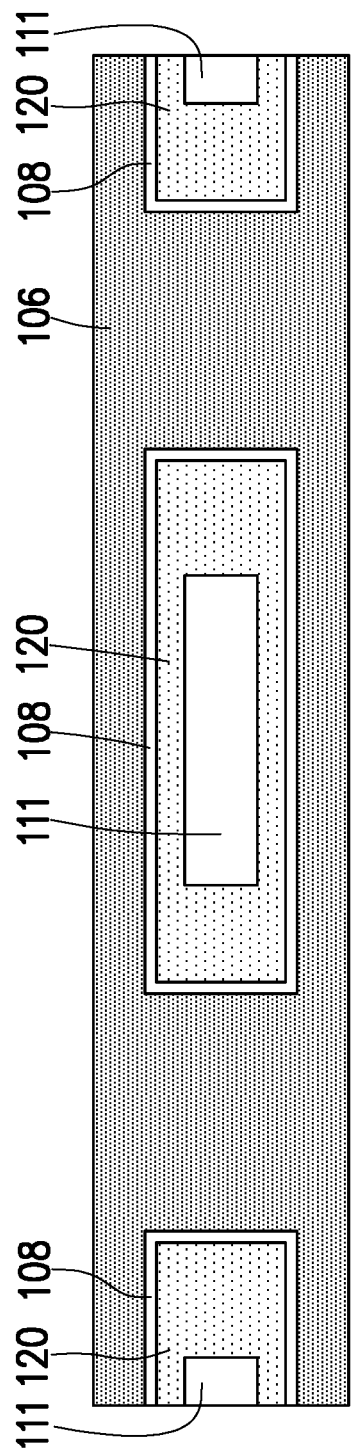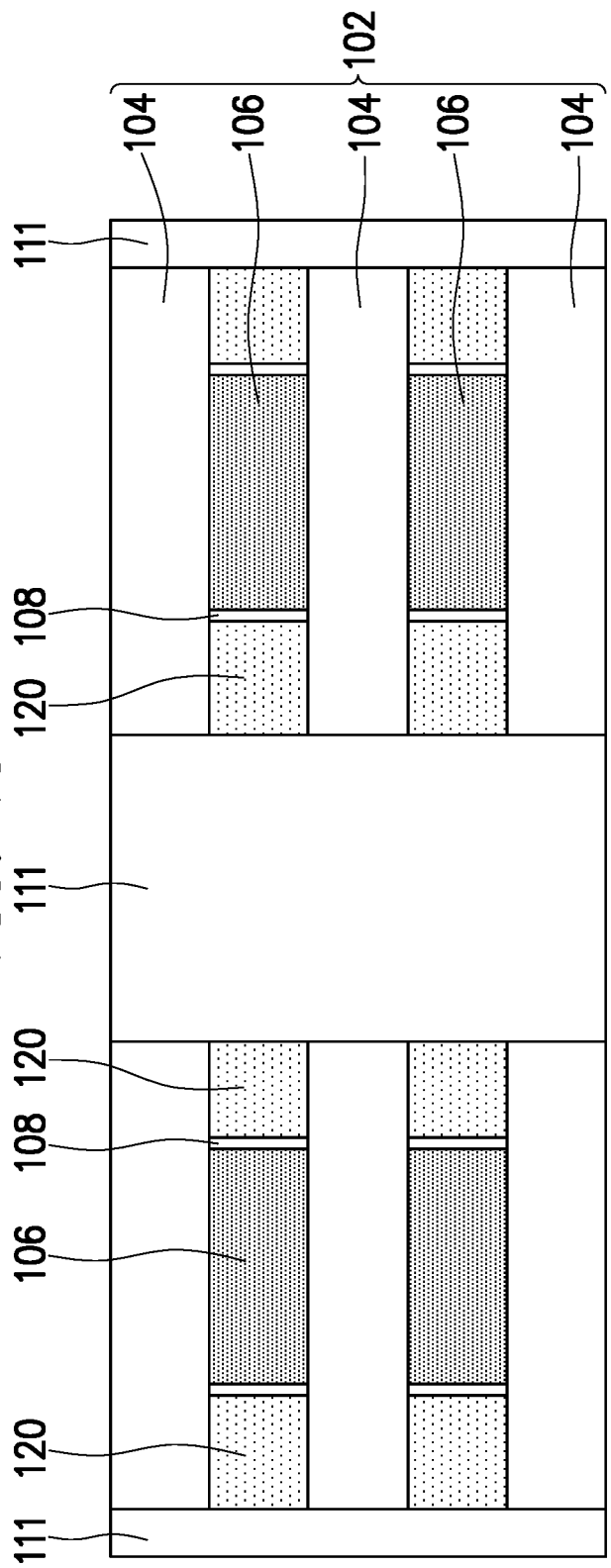

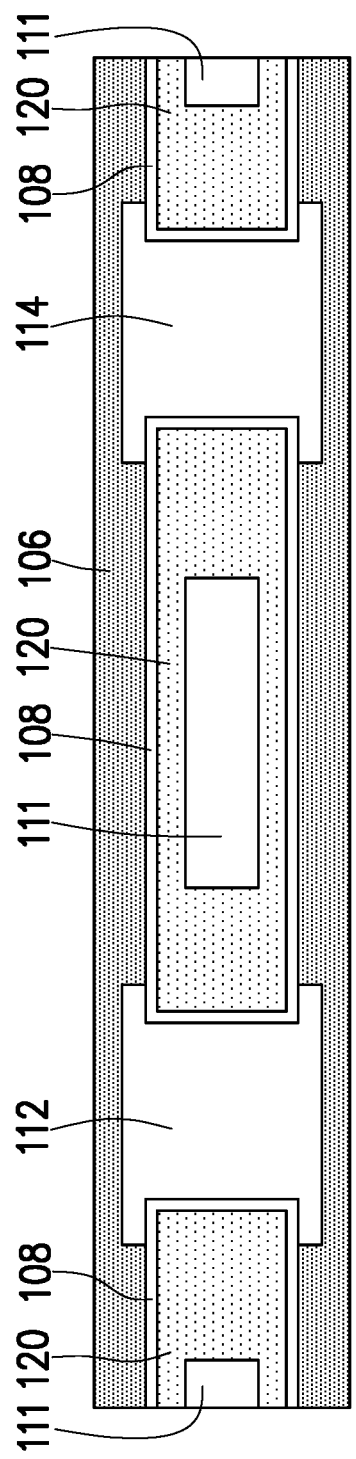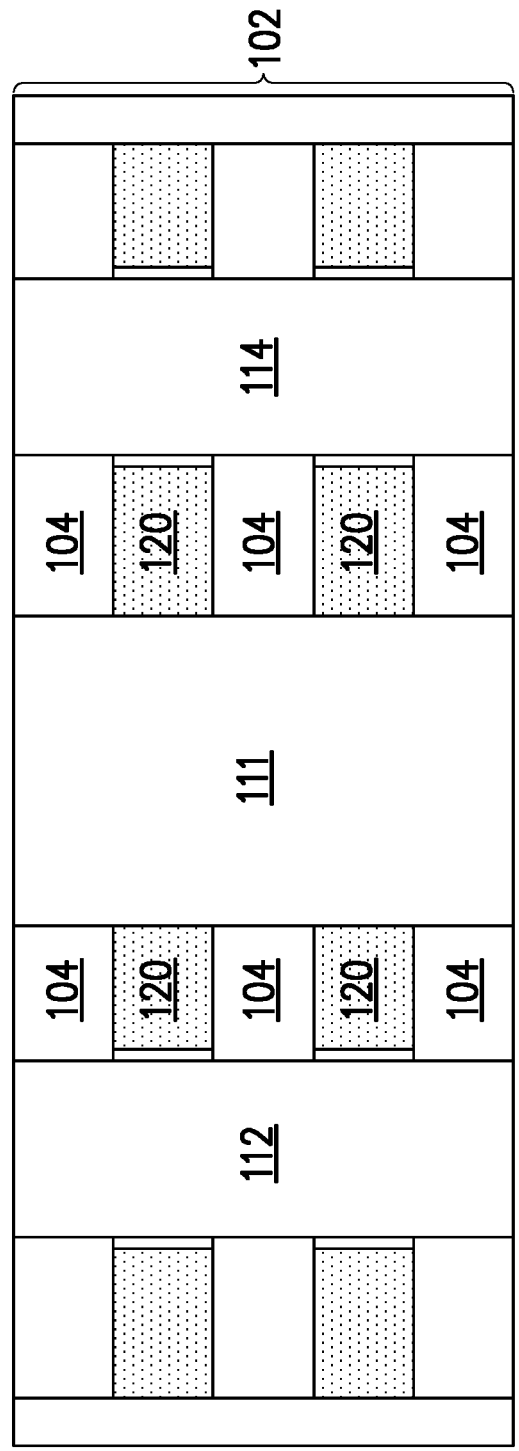
FIG. 1I
FIG. 2I

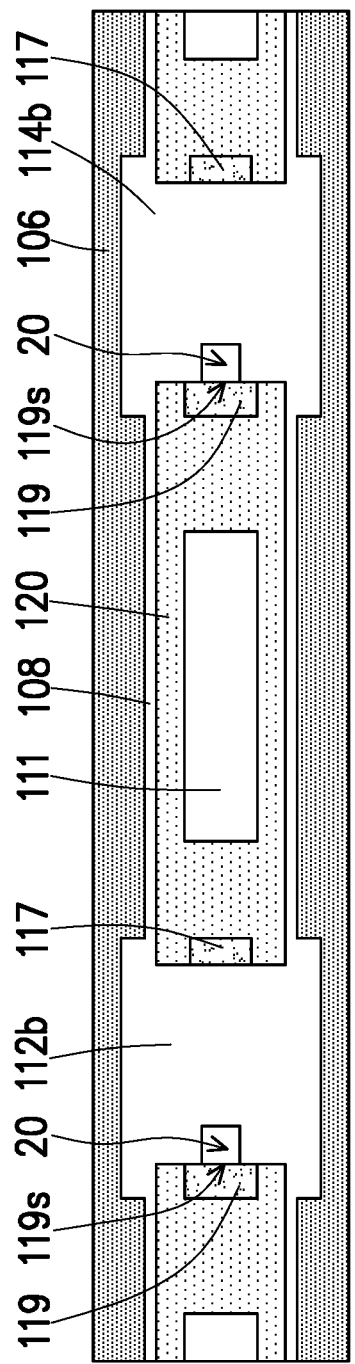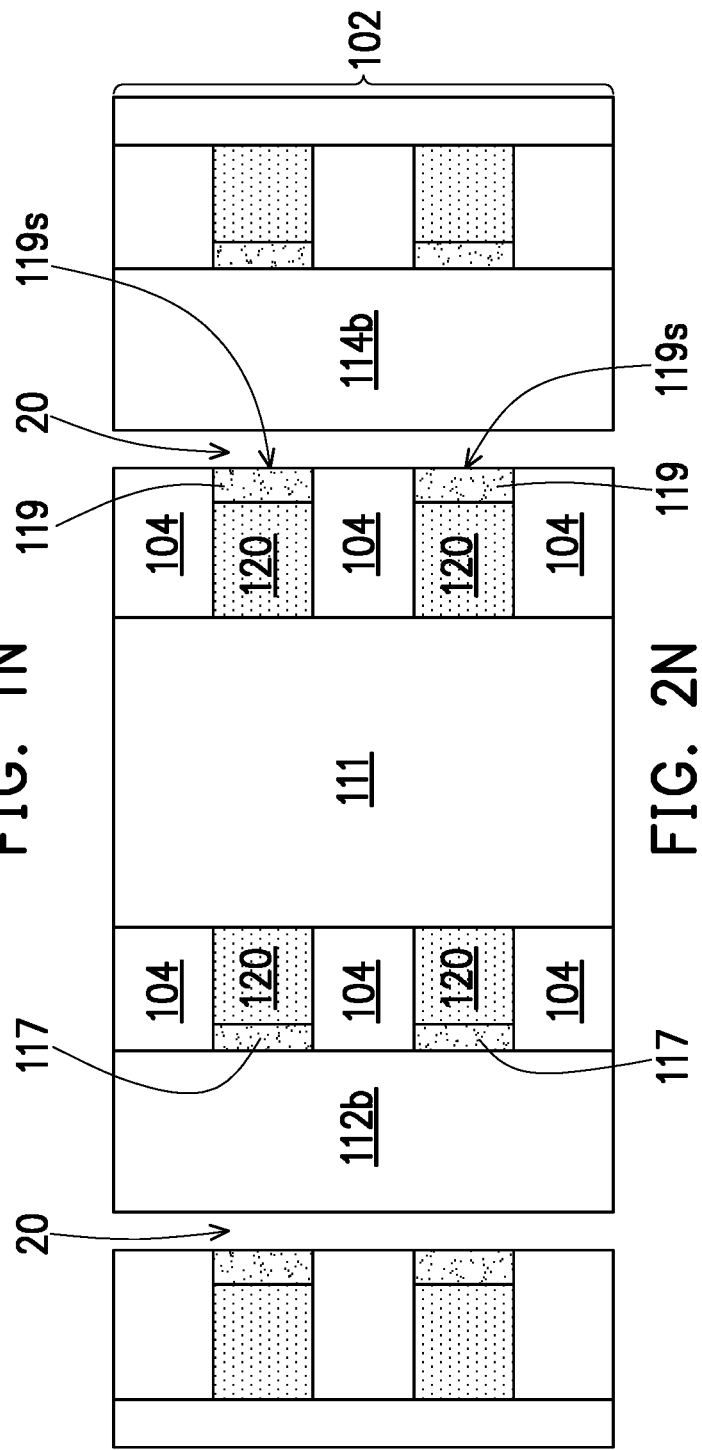
FIG. 1N
FIG. 2N

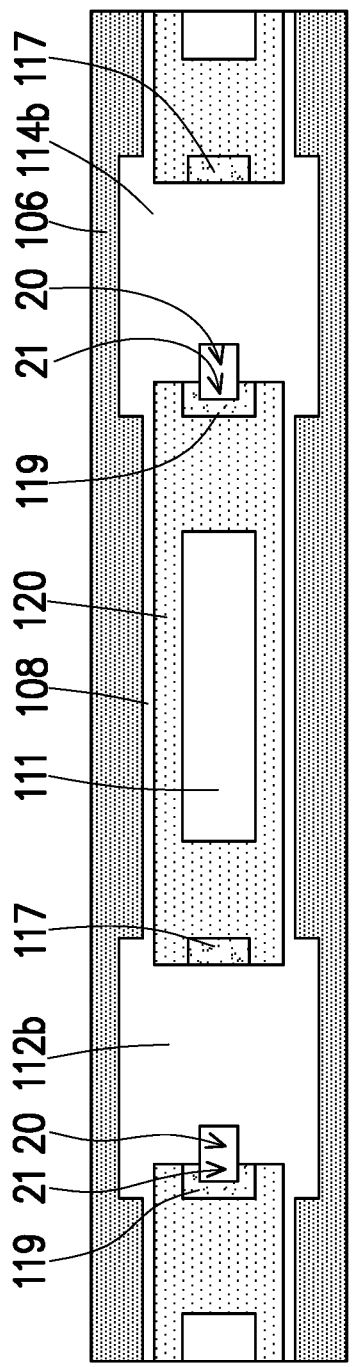
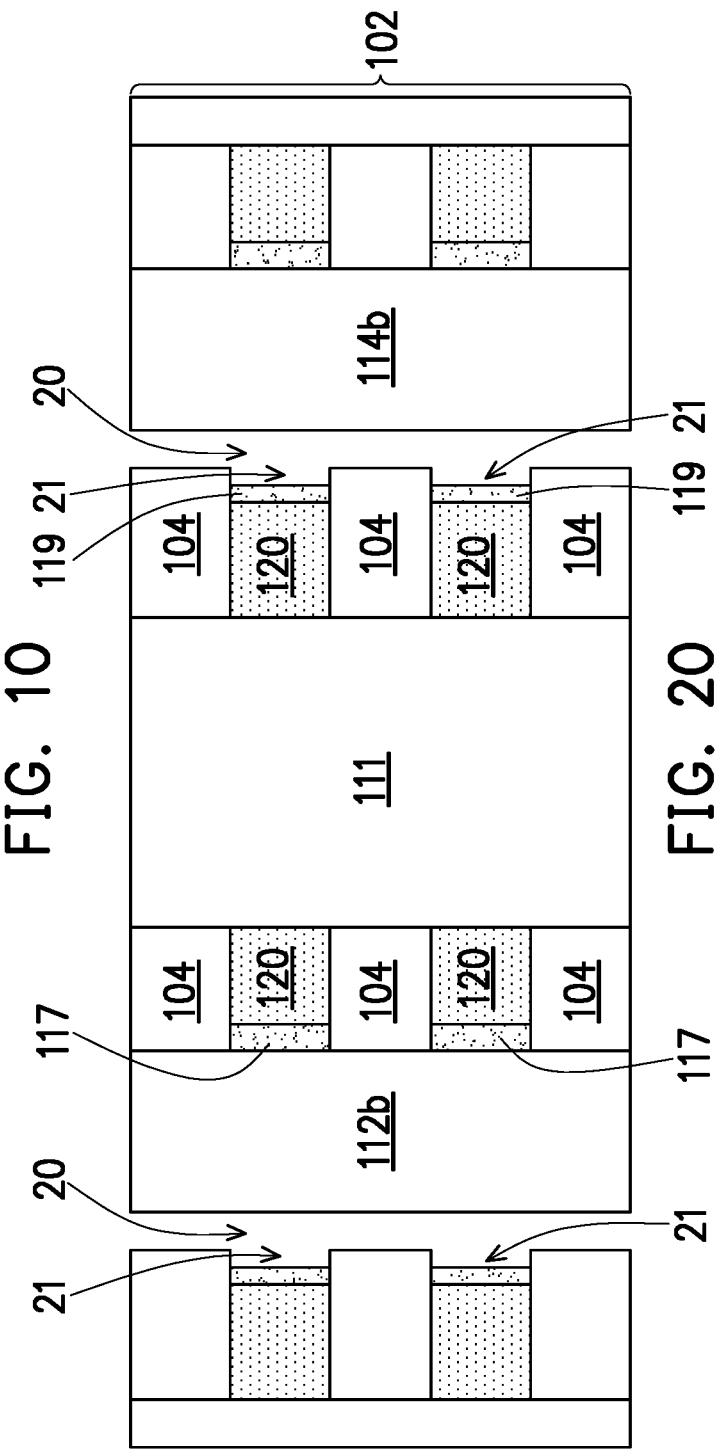

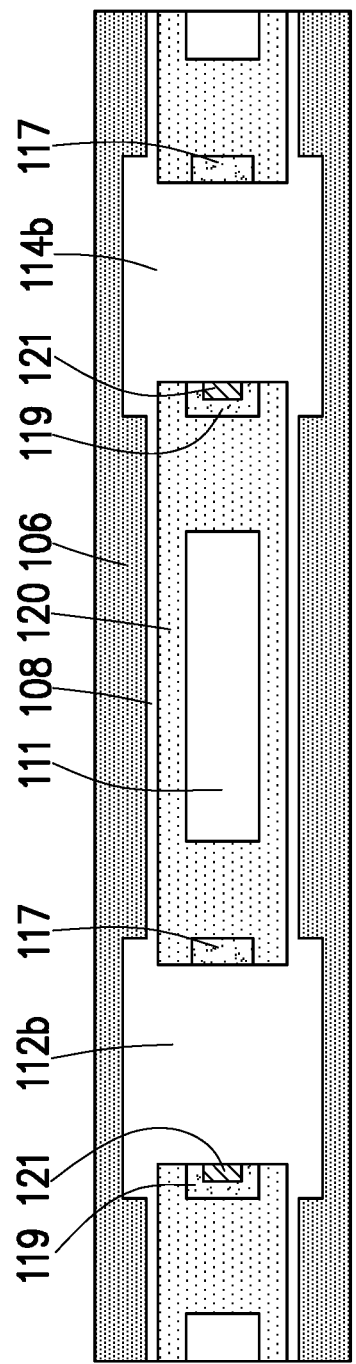
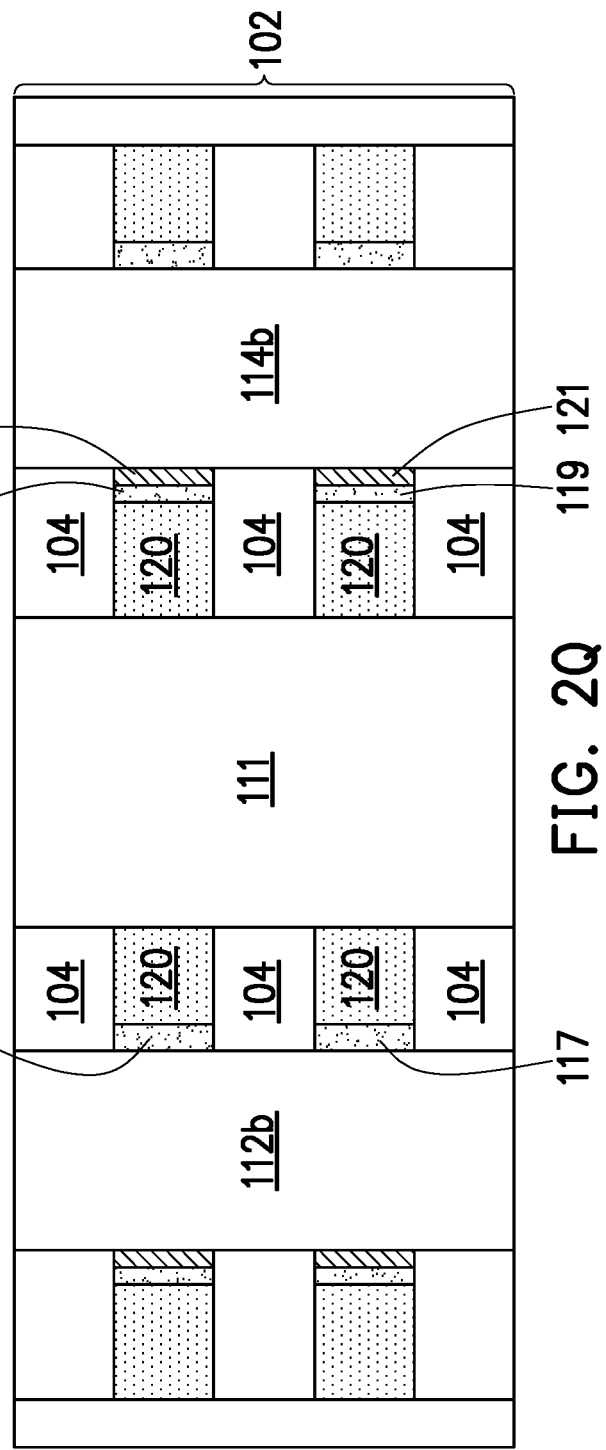
FIG. 1Q
FIG. 2Q

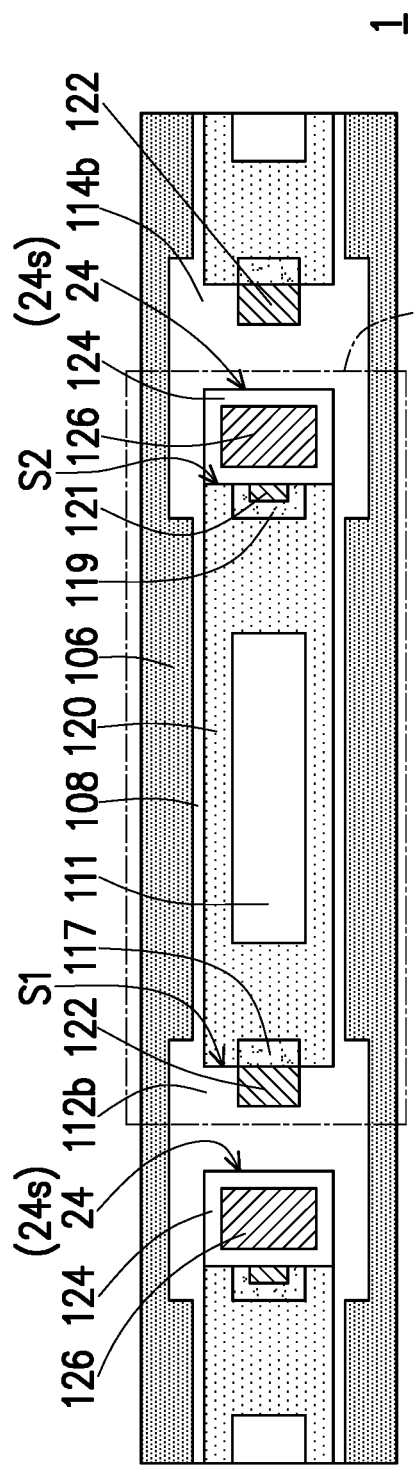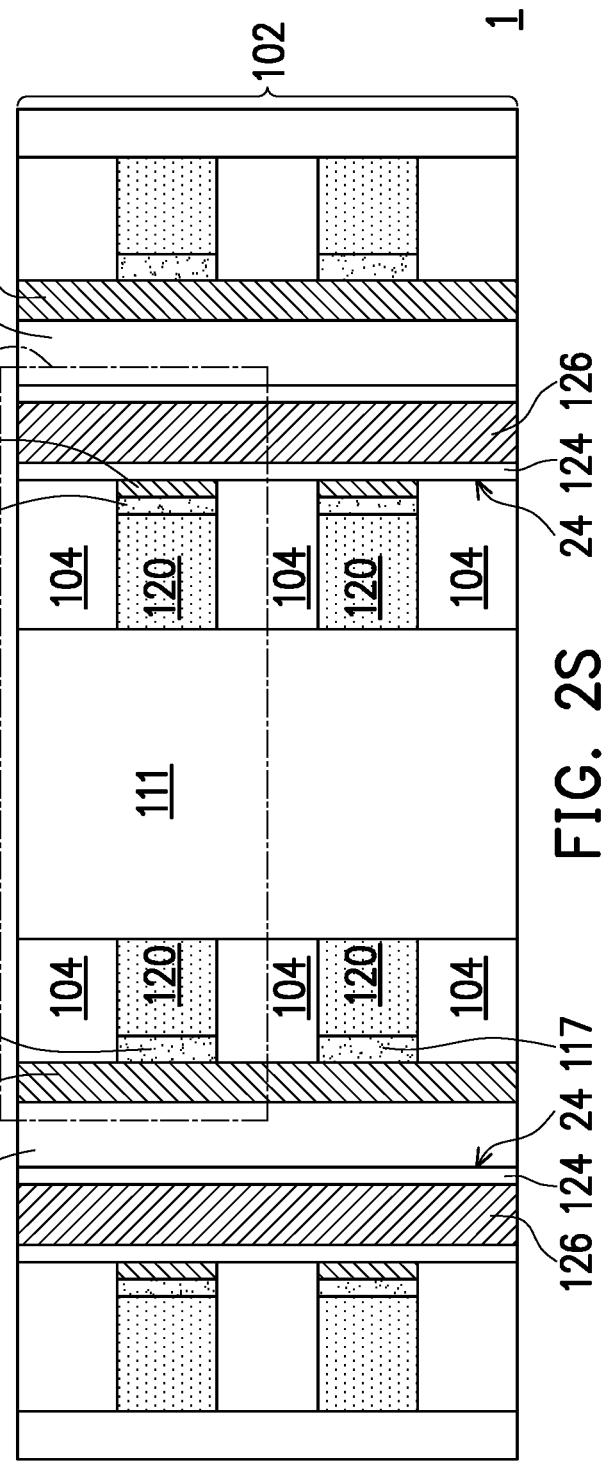

MEMORY DEVICE AND METHOD OF MANUFACTURING THE SAME

BACKGROUND OF THE INVENTION

Field of the Invention

The present invention relates to a memory device and a method of manufacturing the same.

Description of Related Art

With the advancement of semiconductor technology, various electronic products are developing towards high-speed, high-performance, lighter, thinner, and smaller trends. Under this trend, the demand for memory with higher storage capacity has also increased. Accordingly, the design of memory has also been developed towards a three-dimensional memory structure with high integration and high density.

SUMMARY OF THE INVENTION

The invention provides a memory device and a method of manufacturing the same, where a plurality of memory cells are surrounded by the gate disposed at the same level, so that the plurality of memory cells share the same gate voltage, thereby simplifying the routing layout of the gate.

The invention provides a memory device and a method of manufacturing the same, which can increase the current of the memory cell by increasing the thickness of the channel layer in the vertical direction. In the case, the present invention is able to effectively utilize the area of the chip in the horizontal direction and increase the integration density of the memory device, thereby facilitating the miniaturization of the chip.

The invention provides a memory device including a stack structure, a plurality of channel layers, a source line, a bit line, a switching layer, and a dielectric pillar. The stack structure has a plurality of dielectric layers and a plurality of conductive layers stacked alternately. The plurality of channel layers are respectively embedded in the plurality of conductive layers. The source line penetrates through the stack structure to be electrically connected to the plurality of channel layers at first sides of the plurality of channel layers. The bit line penetrates through the stack structure to be coupled to the plurality of channel layers at second sides of the channel layers. The switching layer wraps the bit line to contact the plurality of channel layers at the second sides of the channel layers. The dielectric pillar penetrates through the plurality of channel layers to cut each channel layer into a doughnut shape.

The invention provides a method of manufacturing a memory device including: forming a stack structure having a plurality of dielectric layers and a plurality of conductive layers stacked alternately; forming a first opening in the stack structure to penetrate the stack structure; laterally recessing the plurality of conductive layers exposed by the first opening to form a plurality of first recesses; forming a gate dielectric layer on sidewalls of the plurality of conductive layers exposed by the plurality of first recesses; respectively forming a plurality of channel layers in the plurality of first recesses; forming a dielectric pillar in the first opening to contact the plurality of channel layers; forming a source line penetrating the stack structure at a first side of the plurality of channel layers; forming a bit line penetrating the stack structure at a second side of the plurality of channel layers; and forming a switching layer wrapping the bit line.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
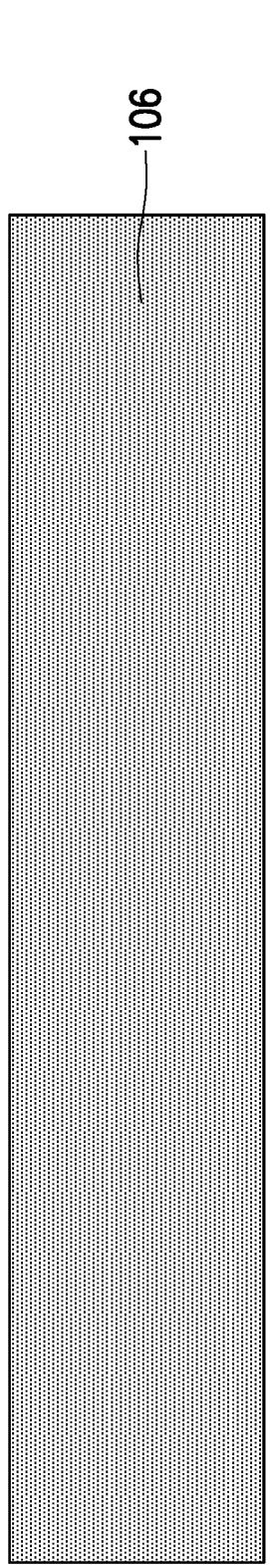
FIG. 1A to FIG. 1S are schematic plan views of a manufacturing process of a memory device according to a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar components, and are not repeated again in the following paragraphs.

Figure 2A:
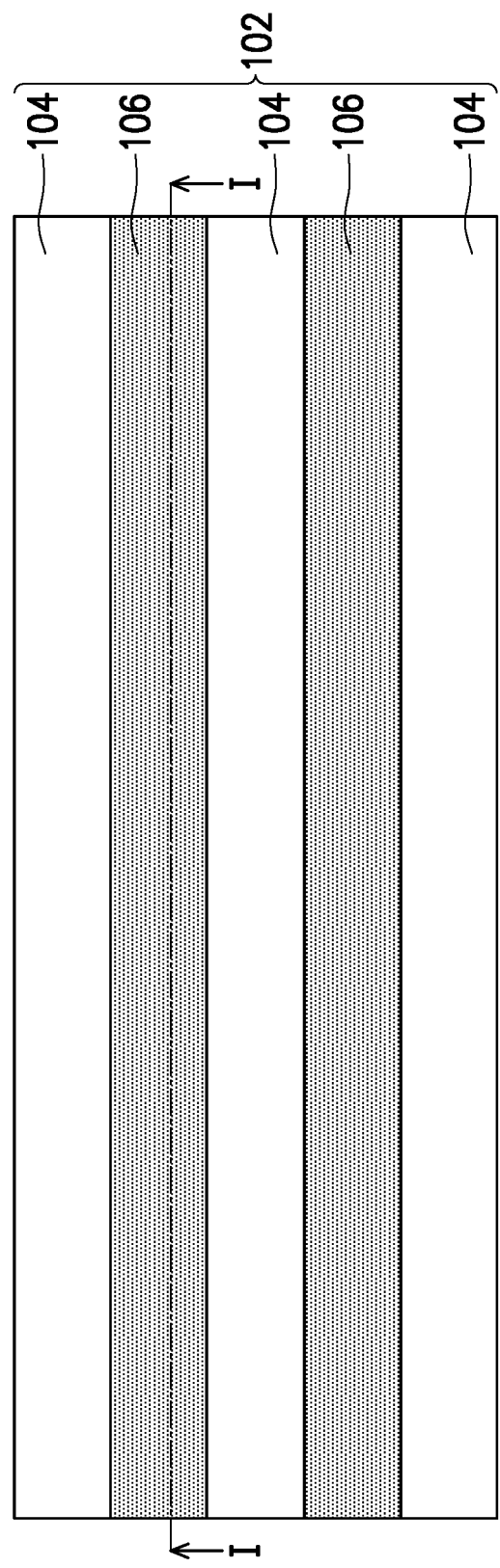
FIG. 2A to FIG. 2S are schematic cross-sectional views of the manufacturing process of the memory device according to the first embodiment of the invention.

FIG. 1A to FIG. 1S are schematic plan views of a manufacturing process of a memory device according to a first embodiment of the invention. FIG. 2A to FIG. 2S are schematic cross-sectional views of the manufacturing process of the memory device according to the first embodiment of the invention. In the following embodiments, FIG. 1A to FIG. 1S are schematic plan views taken along a line I-I of FIG. 2A to FIG. 2S, respectively. For the sake of brevity, the line I-I is only drawn in FIG. 2A, and omitted in FIG. 2B to FIG. 2S.

Referring to FIG. 1A and FIG. 2A, a stack structure 102 having a plurality of dielectric layers 104 and a plurality of conductive layers 106 alternately stacked is formed. In some embodiments, a material of the dielectric layer 104 includes a dielectric material, such as silicon oxide, silicon nitride, silicon oxynitride, or a combination thereof. A material of the conductive layer 106 may include doped polysilicon, undoped polysilicon or a combination thereof. In the embodiment, the dielectric layer 104 may be a silicon oxide layer, and the conductive layer 106 may be a heavily doped P-type (P+) polysilicon layer. Although FIG. 2A only shows three dielectric layers 104 and two conductive layers 106, the present invention is not limited thereto. In other embodiments, the number of the dielectric layers 104 and the conductive layers 106 may be adjusted according to needs.

Referring to FIG. 1B and FIG. 2B, a plurality of openings 10 are formed in the stack structure 102 to penetrate the stack structure 102.

Figure 1C:
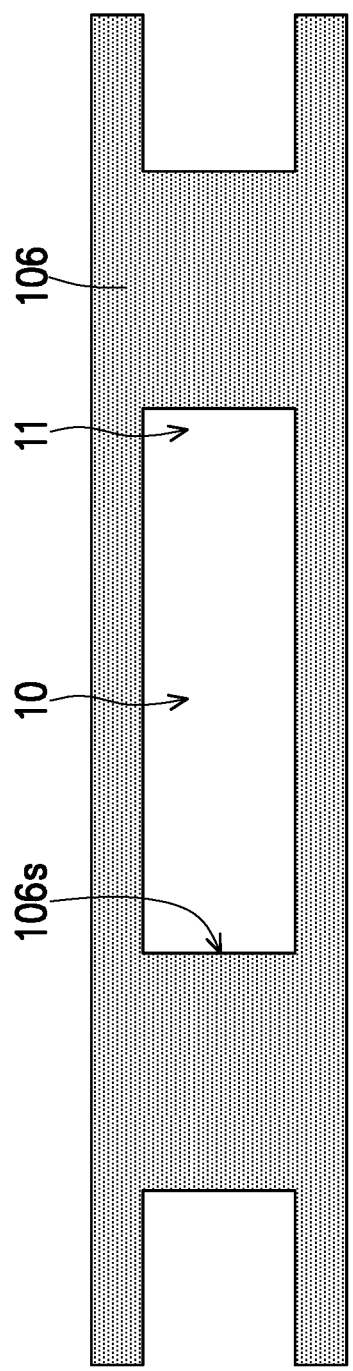
Figure 2C:
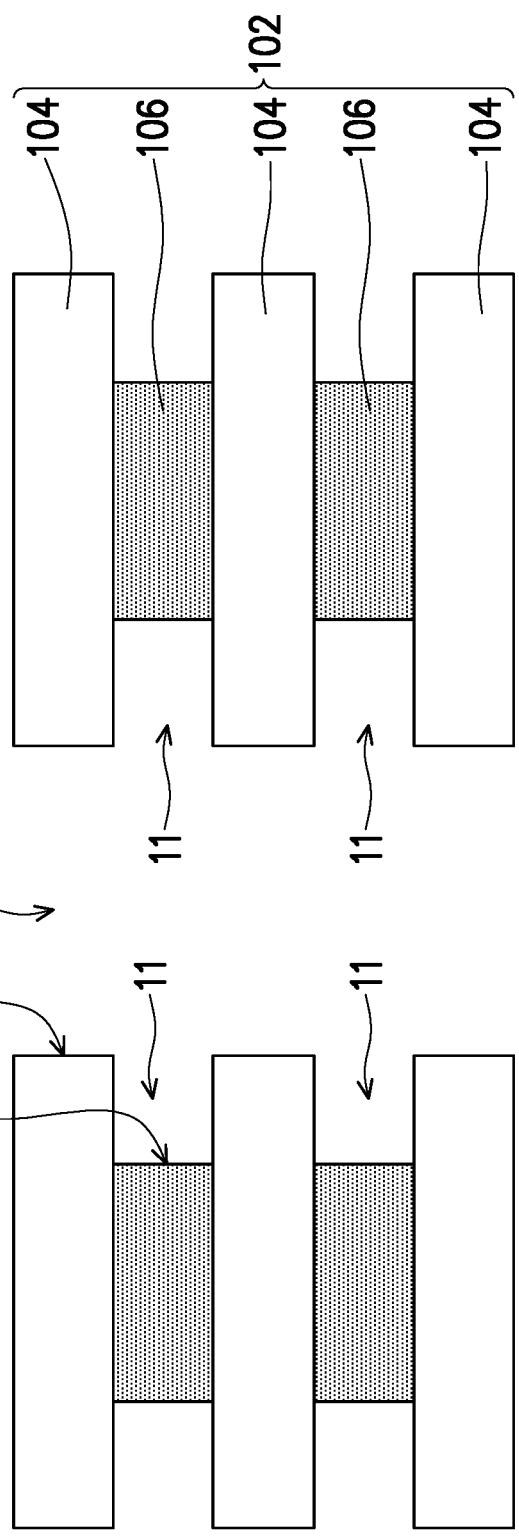

Referring to FIG. 1C and FIG. 2C, a first etching process is performed to laterally recess the conductive layers 106 exposed by the opening 10 (i.e., a first opening), thereby forming a plurality of recesses 11 (i.e., first recesses). In some embodiments, the first etching process includes a wet etching process by using a suitable etchant to selectively etch the conductive layer 106. For example, when the dielectric layer 104 is a silicon oxide layer and the conductive layer 106 is a P-type polysilicon layer, an etchant containing chlorine may be used. In the case, a sidewall 106s of the conductive layer 106 is recessed from a sidewall 104s of the dielectric layer 104, so that the recess 11 is formed between the adjacent dielectric layers 104.

Figure 1D:
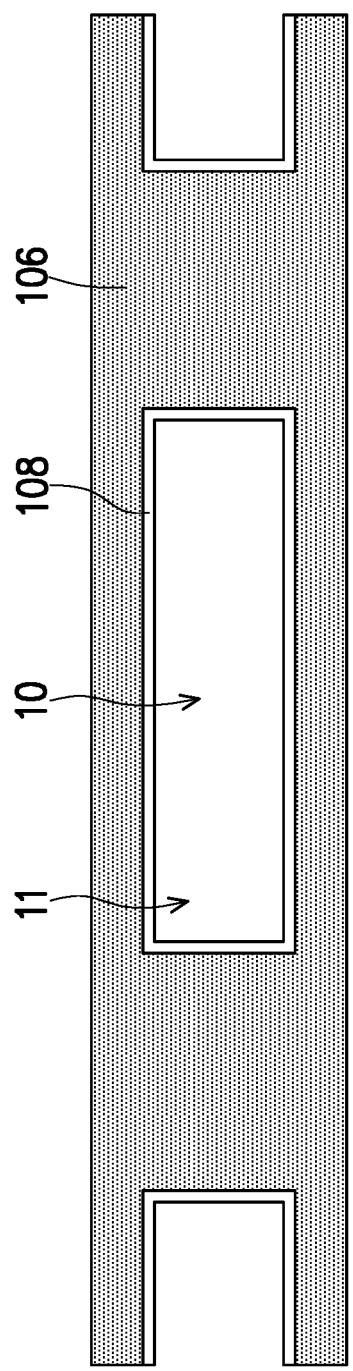
Figure 2D:
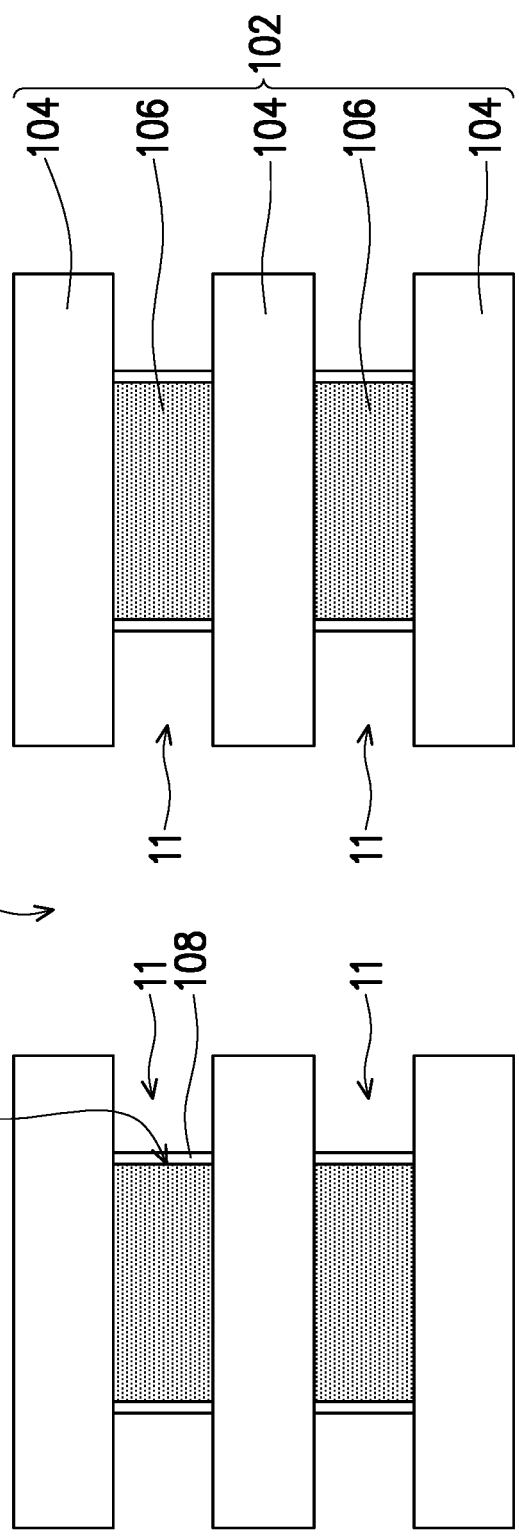

Referring to FIG. 1D and FIG. 2D, a thermal oxidation process is performed to form a gate dielectric layer 108 on the sidewalls 106s of the conductive layers 106 exposed by the recesses 11. In the case, as shown in FIG. 1D, the gate dielectric layer 108 laterally surrounds the composite opening formed by the recess 11 and the opening 10. In some embodiments, the gate dielectric layer 108 may be a silicon oxide layer.

Figure 1E:
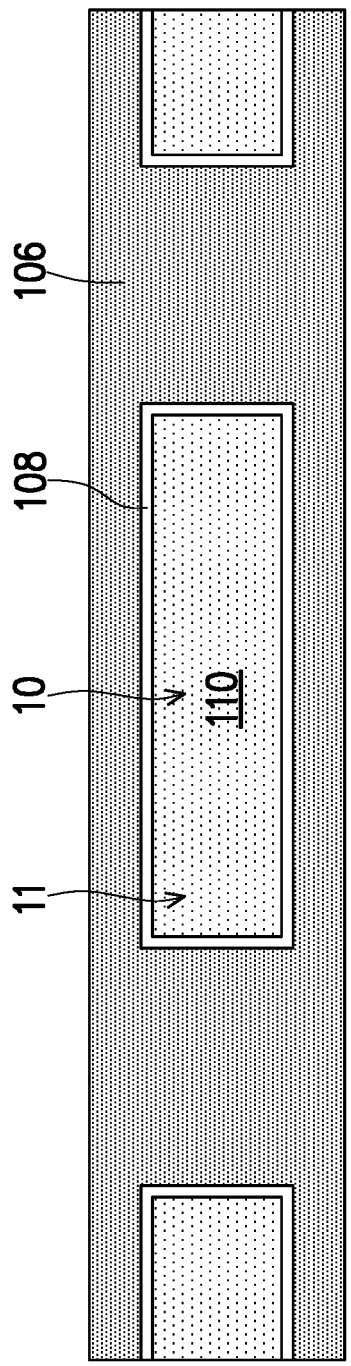
Figure 2E:
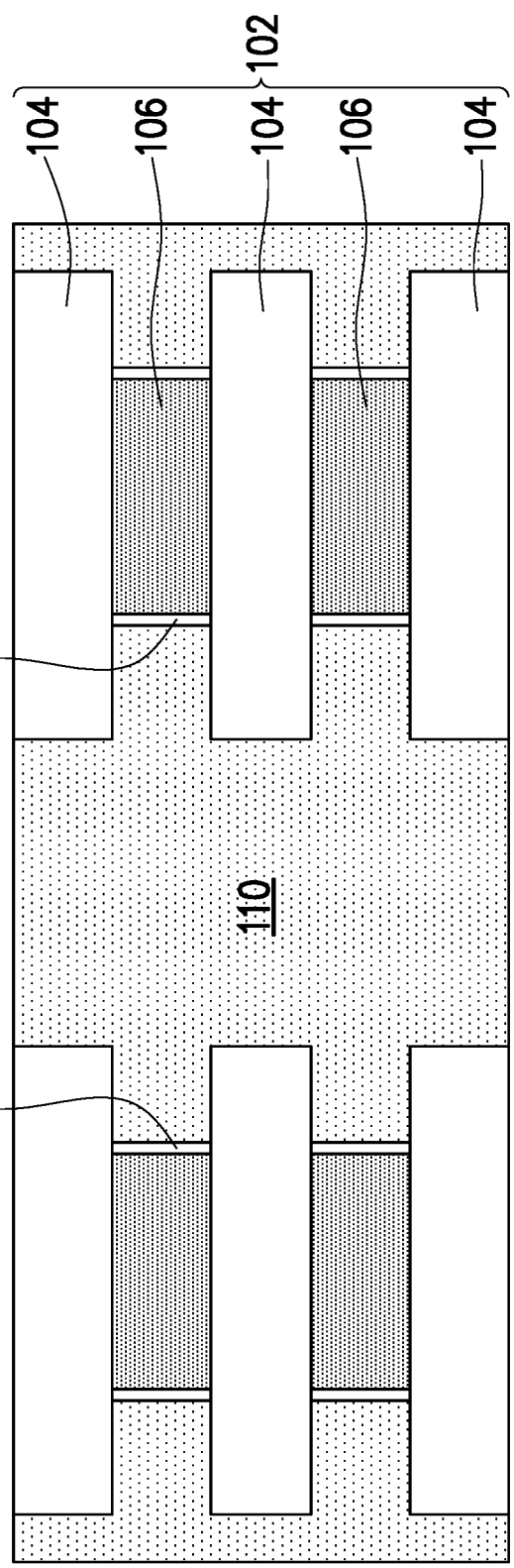

Referring to FIG. 1E and FIG. 2E, a channel material layer 110 is formed to fill in the recesses 11 and the openings 10. In some embodiments, the channel material layer 110 includes polysilicon, epitaxial silicon, indium-gallium-zinc oxide (IGZO), or a combination thereof. In the embodiment, the channel material layer 110 may be lightly doped P-type (P−) polysilicon, and its doping concentration is less than the doping concentration of the conductive layer 106 (P+ polysilicon layer). In other words, the channel material layer 110 and the conductive layers 106 may have the same conductivity type.

Figure 1F:
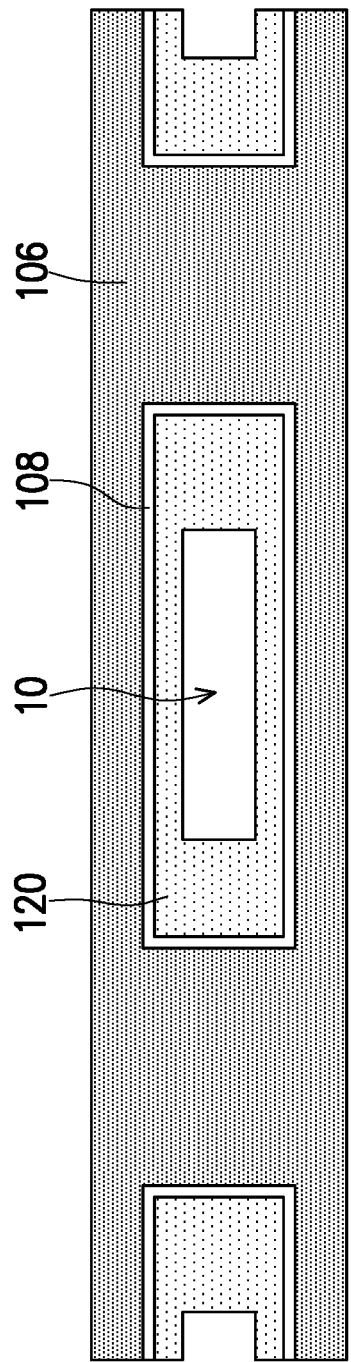
Figure 2F:
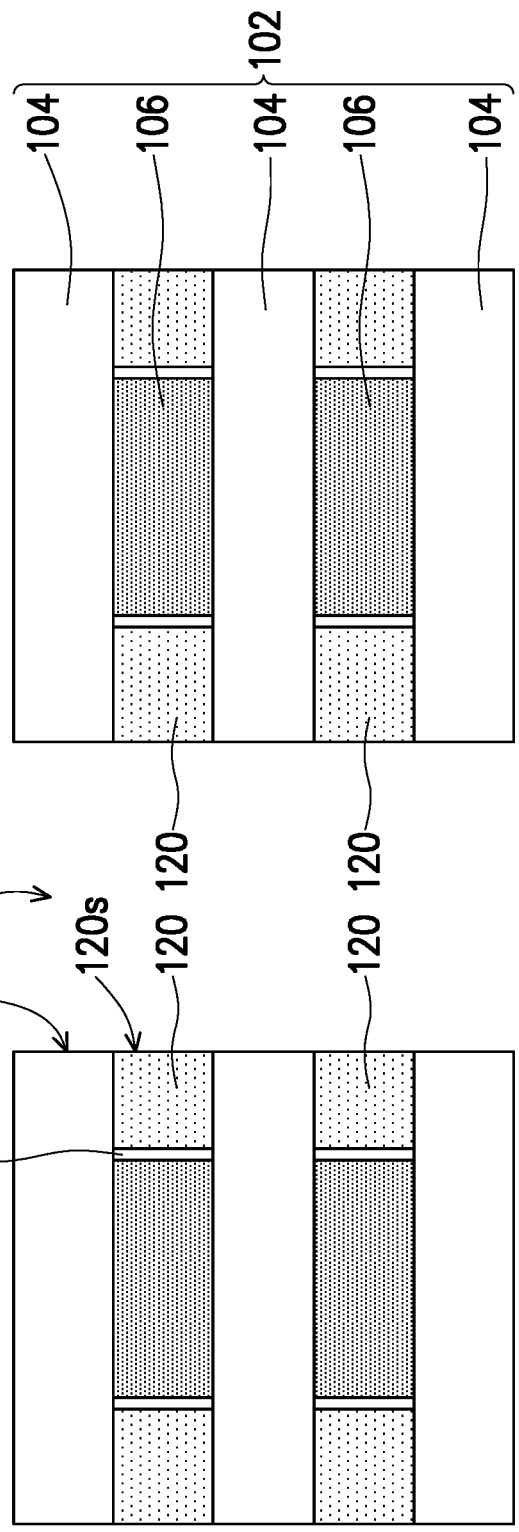

Referring to FIG. 1F and FIG. 2F, the excess channel material layer 110 on the sidewalls 104s of the dielectric layers 104 is removed to form a plurality of channel layers 120 in the recesses 11, respectively. In the case, as shown in FIG. 2F, the sidewall 120s of the channel layer 120 may be aligned with the sidewall 104s of the dielectric layer 104. However, the present invention is not limited thereto. In other embodiments, the sidewall 120s of the channel layer 120 may be slightly recessed from the sidewall 104s of the dielectric layer 104.

Referring to FIG. 1G and FIG. 2G, a dielectric pillar 111 is formed in the opening 10 to contact the channel layer 120 which has a doughnut shape, such that the dielectric pillar 111 is surrounded by the channel layers 120 and the dielectric layer 104. In some embodiments, the dielectric pillar 111 and the dielectric layer 104 may have the same or different dielectric materials.

Figure 1H:
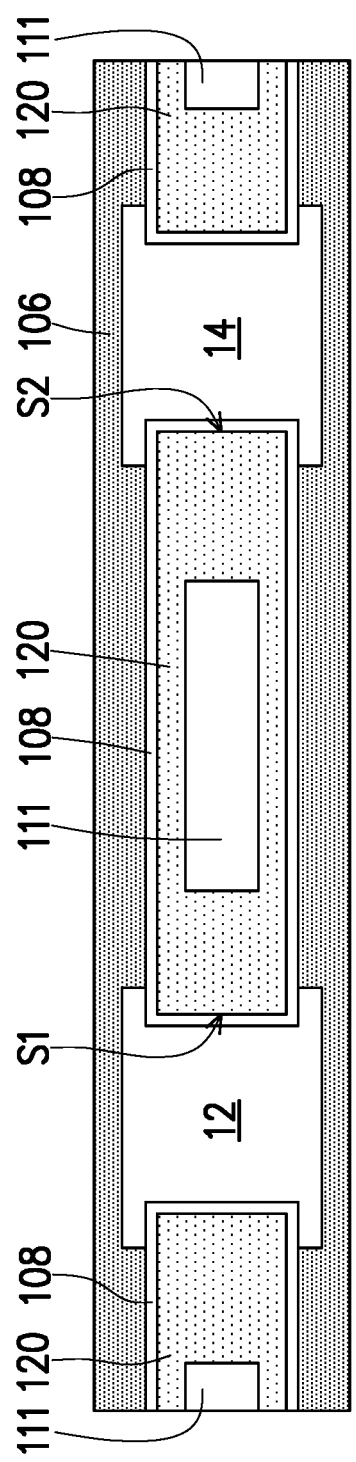
Figure 2H:
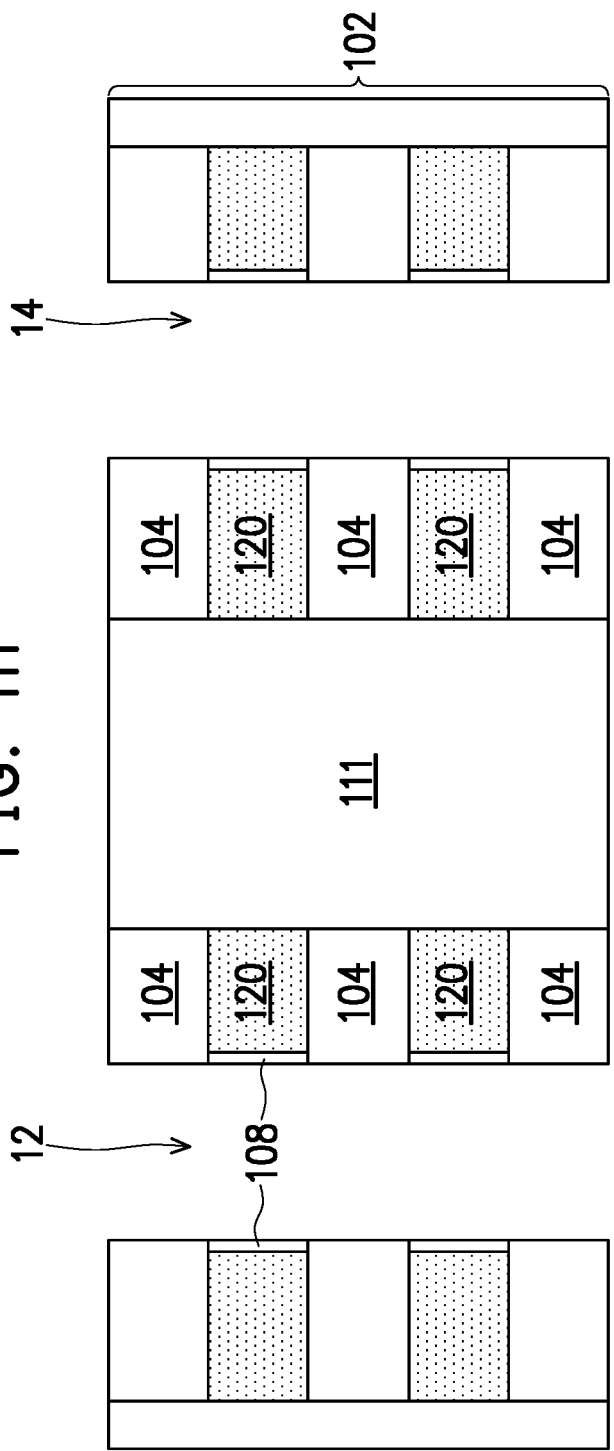

Referring to FIG. 1H and FIG. 2H, an opening 12 penetrating the stack structure 102 is formed at a first side S1 of the channel layer 120, and an opening 14 penetrating the stack structure 102 is formed at a second side S2 of the channel layer 120. The first side S1 of the channel layer 120 is opposite to the second side S2 of the channel layer 120. Specifically, the gate dielectric layer 108 may be referred to as a stop layer for forming the openings 12 and 14. Therefore, the first side S1 of the channel layer 120 may protrude and extends into the opening 12, and the second side S2 of the channel layer 120 may protrude and extends into the opening 14.

Referring to FIG. 1I and FIG. 2I, an isolation material is filled into the opening 12 and the opening 14 respectively, so as to form an isolation structure 112 on the first side S1 of the channel layer 120 and an isolation structure 114 on the second side S2 of the channel layer 120. In the case, the isolation structures 112 and 114 respectively penetrate the stack structure 102 to contact the channel layers 120. In the embodiment, the isolation structures 112 and 114 are used to electrically isolate the channel layers 120 disposed at the same level. In some embodiments, the isolation material includes a dielectric material, such as silicon oxide, silicon nitride, silicon oxynitride, or a combination thereof.

Figure 1J:
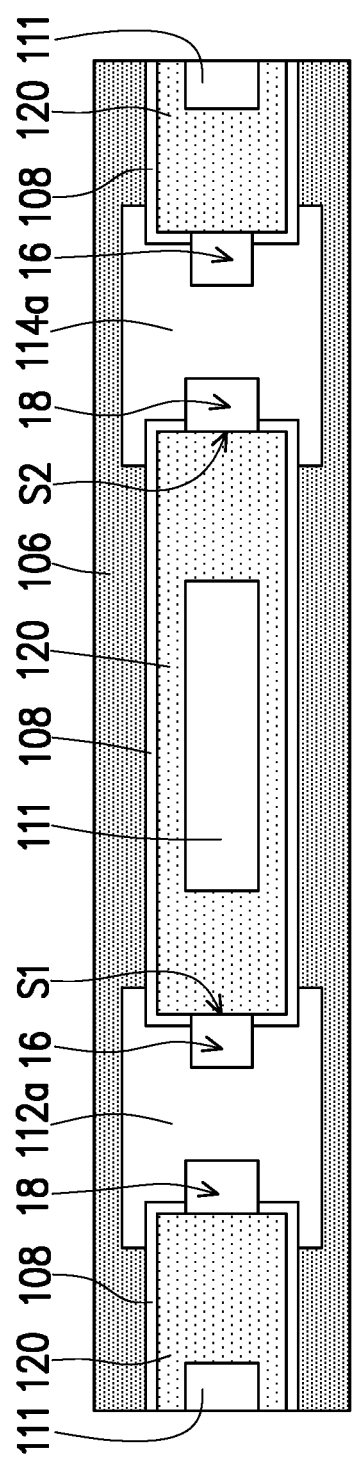
Figure 2J:
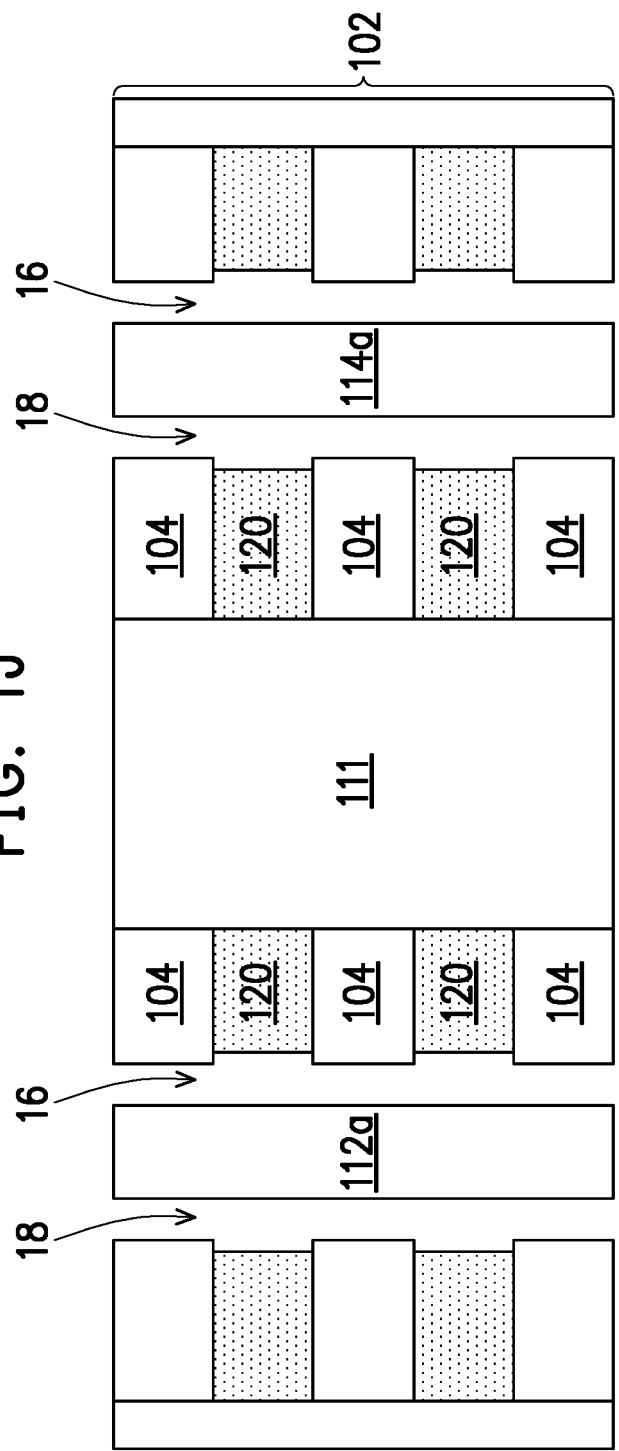

Referring to FIG. 1J and FIG. 2J, an opening 16 (i.e., a second opening) penetrating the isolation structure 112 is formed at the first side S1 of the channel layer 120, and an opening 18 (i.e., a third opening) penetrating the isolation structure 114 is formed at the second side S2 of the channel layer 120. In particular, a portion of the gate dielectric layer 108 at the first side S1 of the channel layer 120 may be further removed, so that the opening 16 contacts the first side S1 of the channel layer 120. On the other hand, a portion of the gate dielectric layer 108 at the second side S2 of the channel layer 120 may be further removed, so that the opening 18 contacts the second side S2 of the channel layer 120. Further, each of the openings 16 and 18 are surrounded by the isolation structures 112a, 114a, and the channel layer 120, and each of the isolation structures 112a and 114a becomes an "I" shape after the openings 16 and 18 are formed.

Figure 1K:
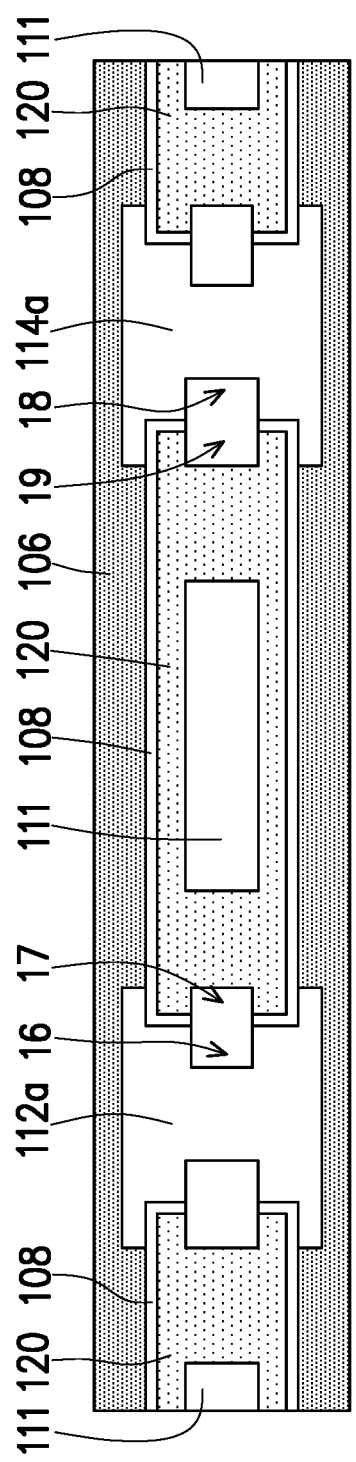
Figure 2K:
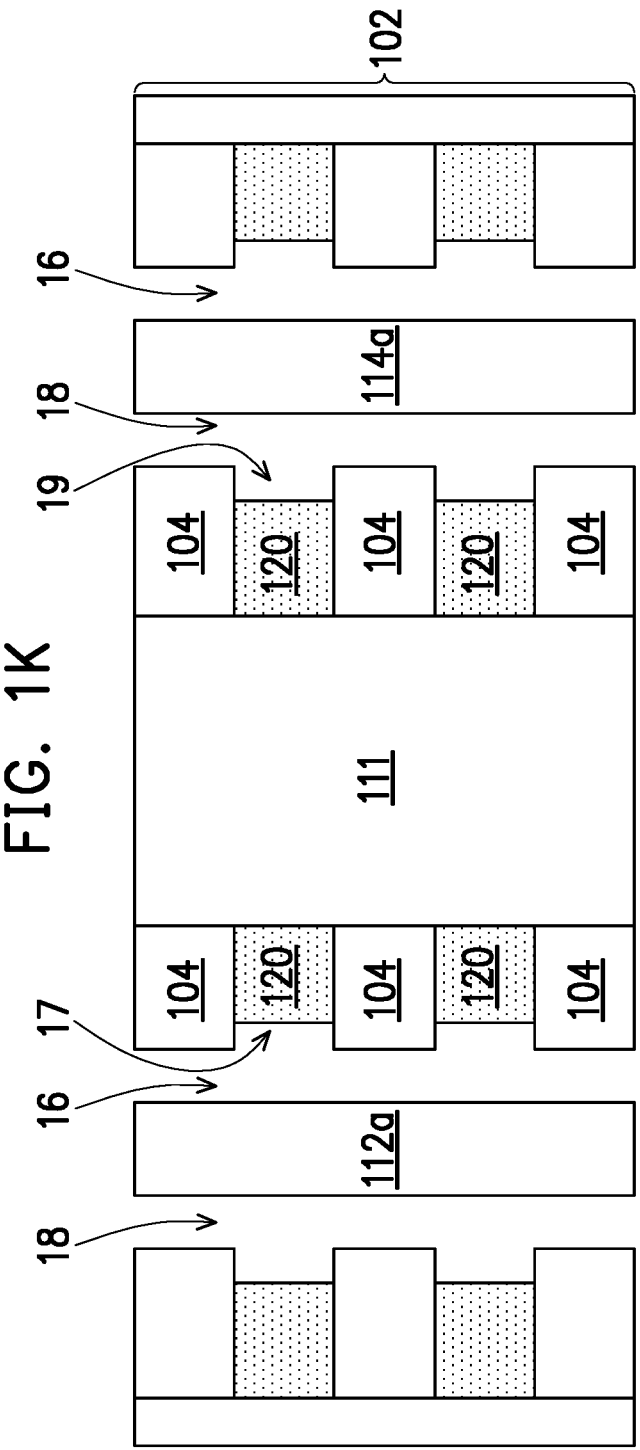

Referring to FIG. 1K and FIG. 2K, the second etching process is performed to laterally recess a part of the first sides S1 of the channel layers 120 exposed by the opening 16 to form a plurality of recesses 17 (i.e., second recesses) communicating with the opening 16, and to laterally recess a part of the second sides S2 of the channel layers 120 exposed by the opening 18 to form a plurality of recesses 19 (i.e., third recesses) communicating with the opening 18. In some embodiments, the second etching process includes a wet etching process by using a suitable etchant to selectively etch the channel layer 120. For example, when the dielectric layer 104 and the isolation structures 112a and 114a are silicon oxide layers and the channel layer 120 is a P− polysilicon layer, an etchant containing chlorine may be used.

Figure 1L:
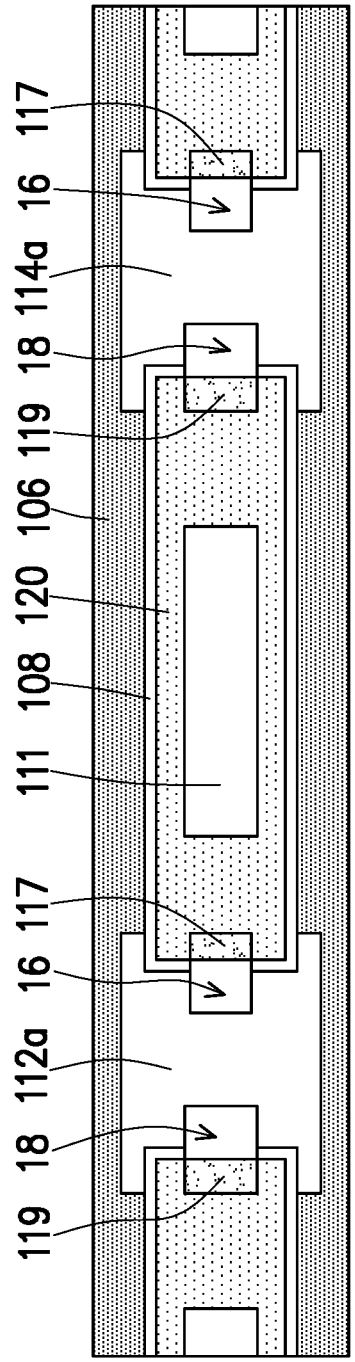
Figure 2L:
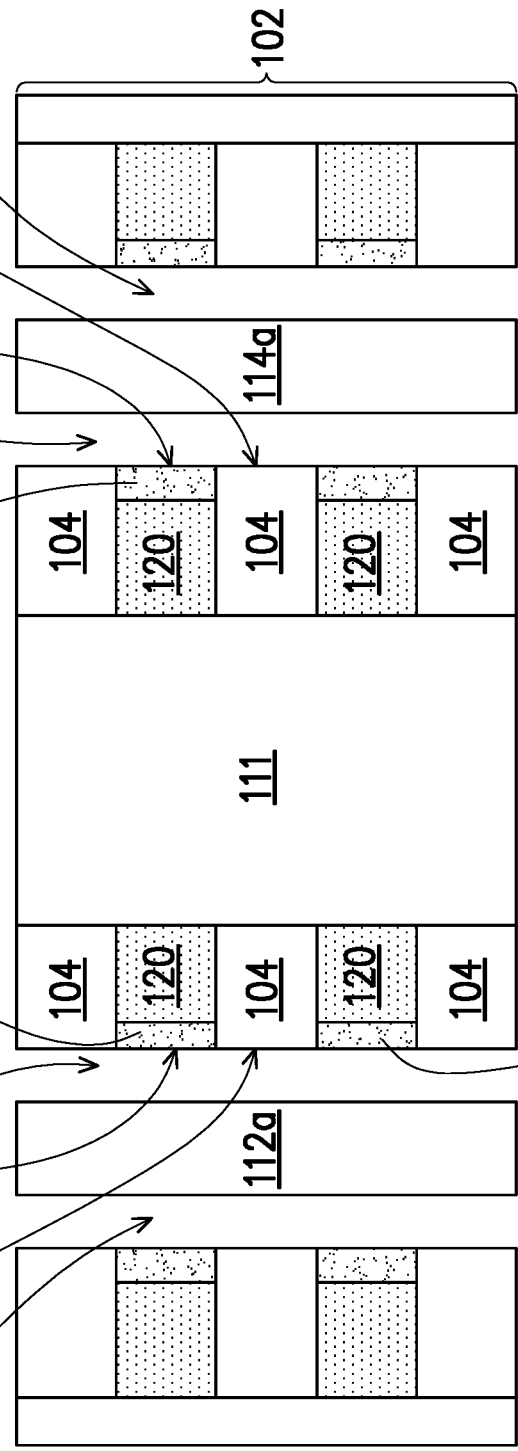

Referring to FIG. 1L and FIG. 2L, a plurality of first contact layers 117 are respectively formed in the recesses 17 and a plurality of second contact layers 119 are respectively formed in the recesses 19. In some embodiments, the first contact layer 117 and the second contact layer 119 may be formed by forming a contact material layer to fill in the recesses 17, 19 and cover the sidewalls 104s of the dielectric layers 104, and then removing the excess contact material layer on the sidewalls 104s of the dielectric layer 104. In the embodiment, the contact material layer may be a heavily doped N-type (N+) polysilicon layer. That is, the first contact layer 117 and the second contact layer 119 have the same conductivity type, but have the different conductivity types from the channel layer 120 (or the conductive layer 106). After forming the first contact layers 117 and the second contact layers 119, as shown in FIG. 2L, a sidewall 117s of the first contact layer 117 may be aligned with the sidewall 104s1 of the dielectric layer 104, and a sidewall 119s of the second contact layer 119 may be aligned with the sidewall 104s2 of the dielectric layer 104. However, the present invention is not limited thereto. In other embodiments, the sidewall 117s of the first contact layer 117 may be slightly recessed from the sidewall 104s1 of the dielectric layer 104, and the sidewall 119s of the second contact layer 119 may be slightly recessed from the sidewall 104s2 of the dielectric layer 104. In the embodiment, the first contact layers 117 and the second contact layers 119 may be formed in the same step.

Figure 1M:
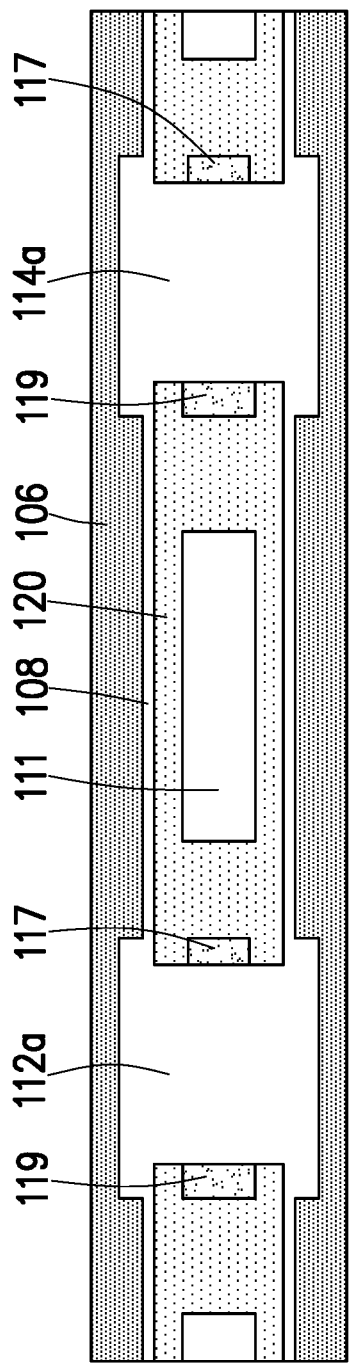
Figure 2M:
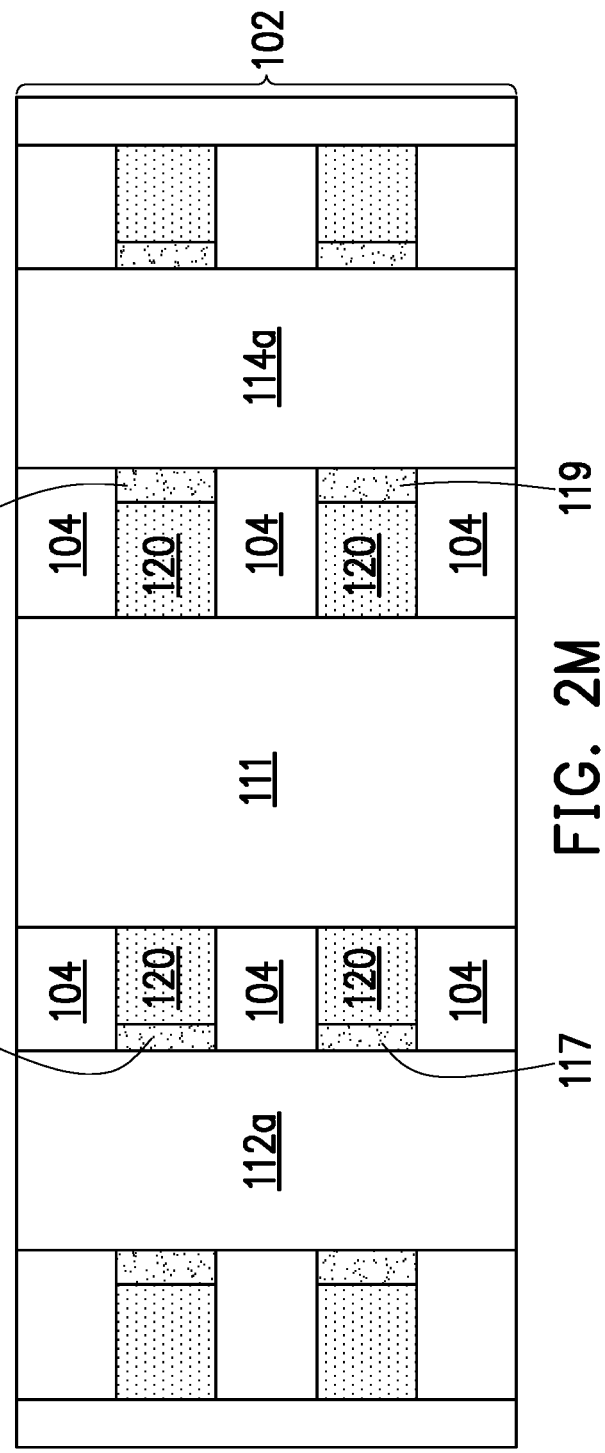

Referring to FIG. 1M and FIG. 2M, an isolation material is filled into the openings 16 and 18 respectively, thereby each of the first contact layer 117 and the second contacts layer 119 are surrounded by the dielectric layer 104, the channel layers 120 and one of the isolation structures 112a and 114a. In some embodiments, the isolation material includes a dielectric material, such as silicon oxide, silicon nitride, silicon oxynitride, or a combination thereof. In the embodiment, the isolation material, the isolation structures 112a and 114a, and the gate dielectric layer 108 may have the same material, thus they can be illustrated as the same film or layer in FIG. 1M and FIG. 2M.

Referring to FIG. 1N and FIG. 2N, an opening 20 (i.e., a fourth opening) penetrating the isolation structure 114b (or 112b) is formed at the outer side (sidewall) 119s of the second contact layer 119. In the case, as shown in FIG. 2N, the opening 20 exposes the outer sides 119s of the second contact layers 119, and the opening 20 is surrounded by the isolation structure 114b (or 112b) which becomes a "U" shape after the opening 20 is formed.

Referring to FIG. 1O and FIG. 2O, a third etching process is performed to laterally recess a part of the second contact layers 119 exposed by the opening 20, thereby forming a plurality of recesses 21 (i.e., fourth recesses) communicating with the opening 20. In some embodiments, the third etching process includes a wet etching process by using a suitable etchant to selectively etch the second contact layer 119. For example, when the dielectric layer 104 and the isolation structures 112b and 114b are silicon oxide layers and the second contact layer 119 is an N+ polysilicon layer, an etchant containing chlorine may be used.

Figure 1P:
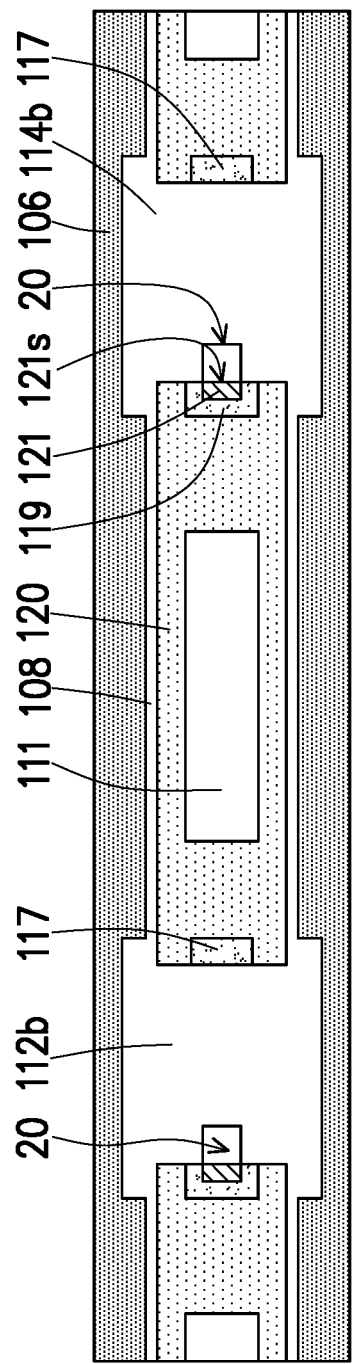
Figure 2P:
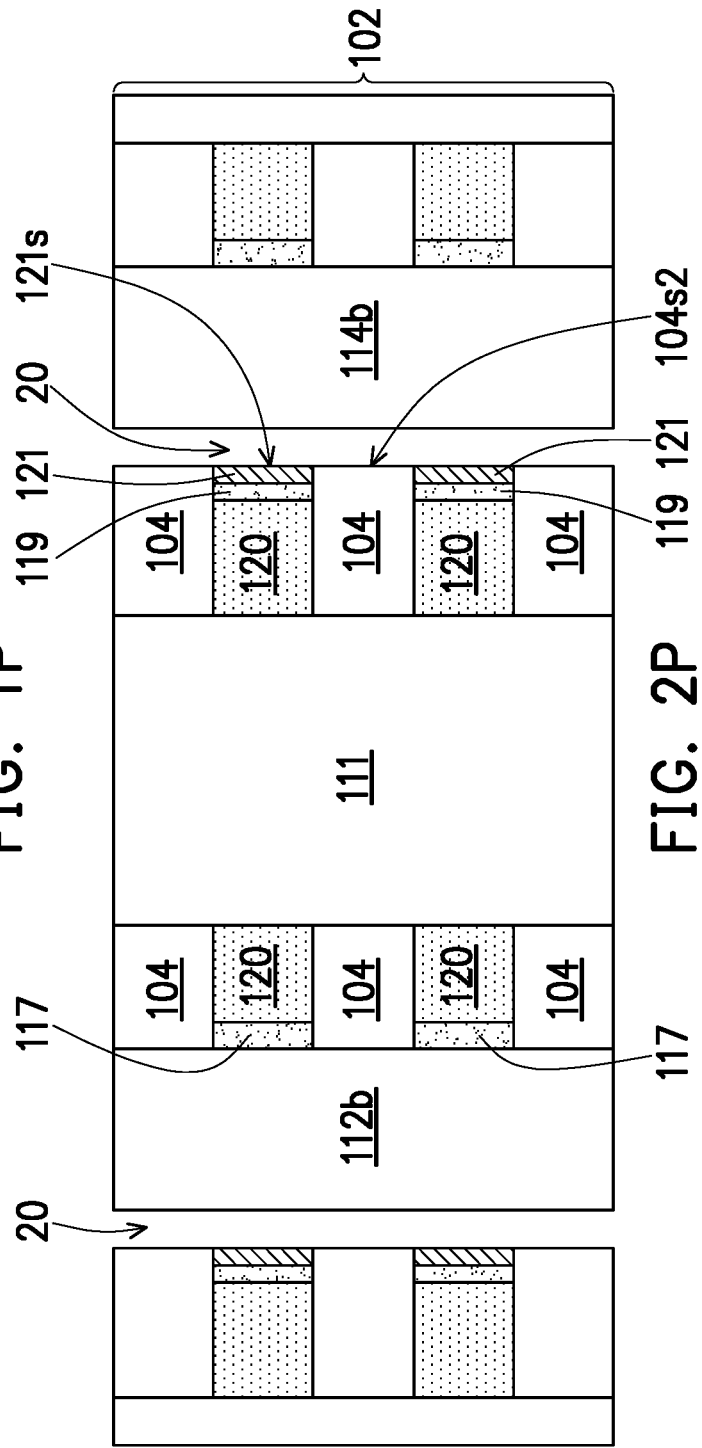

Referring to FIG. 1P and FIG. 2P, a plurality of electrode layers 121 are respectively formed in the recesses 21. In some embodiments, the electrode layers 121 may be formed by forming an electrode material layer (e.g., a TiN layer) to fill in the recesses 21, e.g., by chemical vapor deposition (CVD), and cover the sidewalls 104s2 of the dielectric layers 104, and then removing the excess electrode material layer on the sidewalls 104s2 of the dielectric layers 104. In the case, as shown in FIG. 2P, a sidewall 121s of the electrode layer 121 may be aligned with the sidewall 104s2 of the dielectric layer 104. However, the present invention is not limited thereto. In other embodiments, the sidewall 121s of the electrode layer 121 may be slightly recessed from the sidewall 104s2 of the dielectric layer 104.

Referring to FIG. 1Q and FIG. 2Q, an isolation material is filled into the openings 20, thereby the electrode layer 121 is surrounded by the dielectric layer 104, the second contact layers 119, and the isolation structures 112b or 114b. In some embodiments, the isolation material includes a dielectric material, such as silicon oxide, silicon nitride, silicon oxynitride, or a combination thereof. In the embodiment, the isolation material and the isolation structures 112b and 114b may have the same material, thus they can be illustrated as the same film or layer in FIG. 1Q and FIG. 2Q.

Figure 1R:
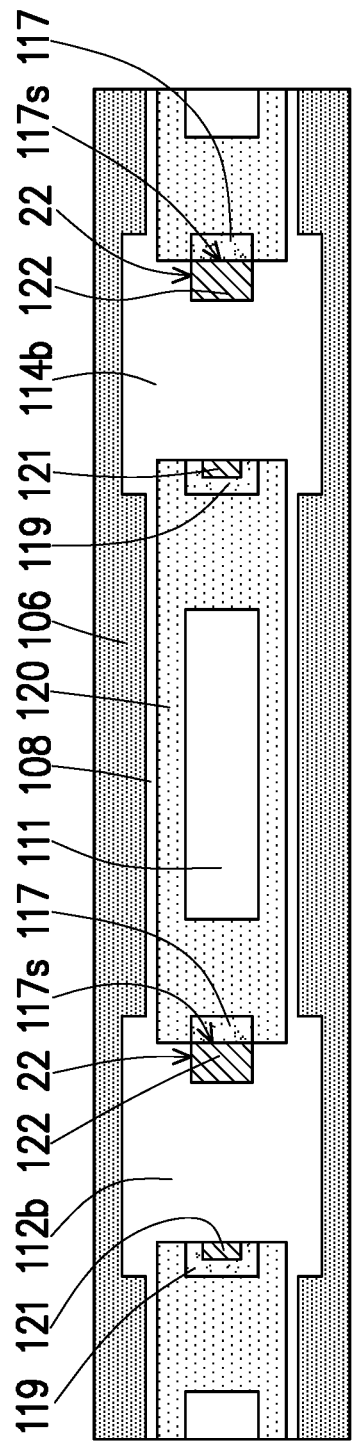
Figure 2R:
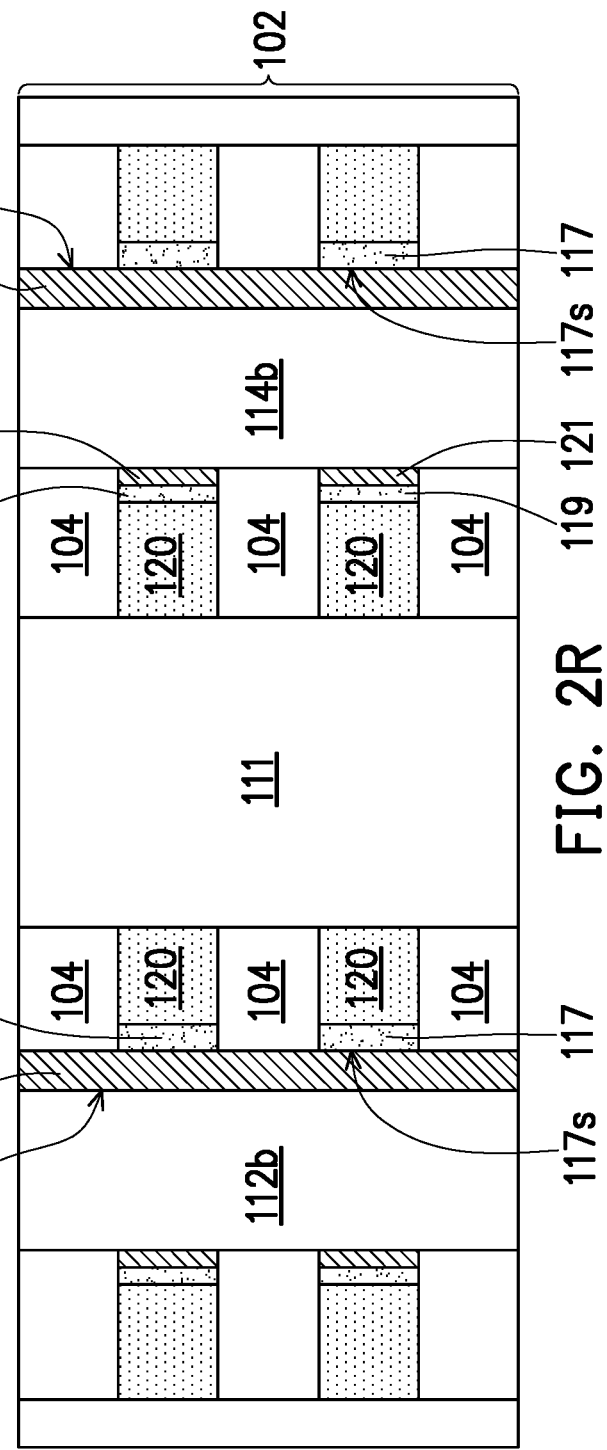

Referring to FIG. 1R and FIG. 2R, an opening 22 (that is, a fifth opening) penetrating the isolation structure 112b (or 114b) is formed at the outer side (sidewall) 117s of the first contact layer 117. Next, a source line material (e.g., W with a TiN liner) is filled into the opening 22 to form a source line 122 contacting the first contact layers 117.

Referring to FIG. 1S and FIG. 2S, an opening 24 (that is, a sixth opening) penetrating the isolation structure 114b (or 112b) is formed at the outer side (sidewall) 121s of the electrode layer 121. Next, a switching layer 124 is formed on an inner surface 24s of the opening 24 to contact the electrode layers 121. Then, a bit line material (e.g., a suitable conductive material such as Ti) is filled in the opening 24 to form the bit line 126 which is wrapped by the switching layer 124, thereby accomplishing a memory device 1.

Referring to FIG. 1S and FIG. 2S, the present disclosure provides a memory device 1 including a stack structure 102, a plurality of channel layers 120, a source line 122, a bit line 126, a switching layer 124, and a dielectric pillar 111. The stack structure 102 has a plurality of dielectric layers 104 and a plurality of conductive layers 106 stacked alternately. The channel layers 120 are respectively embedded in the conductive layers 106. The source line 122 penetrates through the stack structure 102 to be electrically connected to the channel layers 120 at first sides S1 of the channel layers 120. The bit line 126 penetrates through the stack structure 102 to be coupled to the channel layers 120 at second sides S2 of the of channel layers 120. The switching layer 124 wraps the bit line 126 to contact the channel layers 120 at the second sides S2 of the channel layers 120. The dielectric pillar 111 penetrates through the channel layers 120 to divide each channel layer 120 into a doughnut shape.

In some embodiments, the switching layer 124 may include one layer or more than one layer. The bit line 126 may include one layer or more than one layer.

In some embodiments, a material of the switching layer 124 includes a variable resistance material, a phase change material, a ferroelectric material, a capacitive material, or a combination thereof. In other words, depending on the material of the switching layer 124, the memory device 1 may be a resistive random access memory (RRAM), a phase change random access memory (PCRAM), a ferroelectric random access memory (FeRAM), a dynamic random access memory (DRAM), or a combination thereof. Specifically, a memory cell MC may include the channel layer 120, a portion of the source line 122 coupling thereto, and a portion of the bit line 126 coupling thereto. When the memory device 1 is an RRAM, the memory cell MC may include a configuration of 1 transistor and 1 resistor (1T1R). As shown in FIG. 1S, the transistor (1T) includes: the first contact layer 117 used as a source, the second contact layer 119 used as a drain, and the conductive layer 106 used as a gate or a word line. The resistor (1R) includes: the switching layer 124 used as a variable resistance layer, which may change the resistance value of the resistor by adjusting the applied bias voltage, so that the device is in the high resistance state or in the low resistance state, thereby recognizing the digital signals, such as 0 or 1. The switching layer 124 may comprise a sublayer which acts to modulate motion of charged species, e.g., ions, electrons, holes, as well as a sublayer that support the actual resistance-changing structure, e.g., a filament. In some embodiments, the bit line 126 may contain a sublayer in contact with the switching layer 124, which acts as a reservoir for the charged species. In other embodiments, the bit line 126 in its entirety is the reservoir. In some embodiments, as shown in FIG. 1S, the source line 122 of one memory cell MC and the bit line 126 of the adjacent memory cell MC are arranged in the same isolation structure 112 or isolation structure 114. In other words, the isolation structures 112b and 114b may be used to electrically isolate the memory cells MC disposed at the same level to prevent the sneak current or other interference phenomena of the memory cells.

Figure 3:
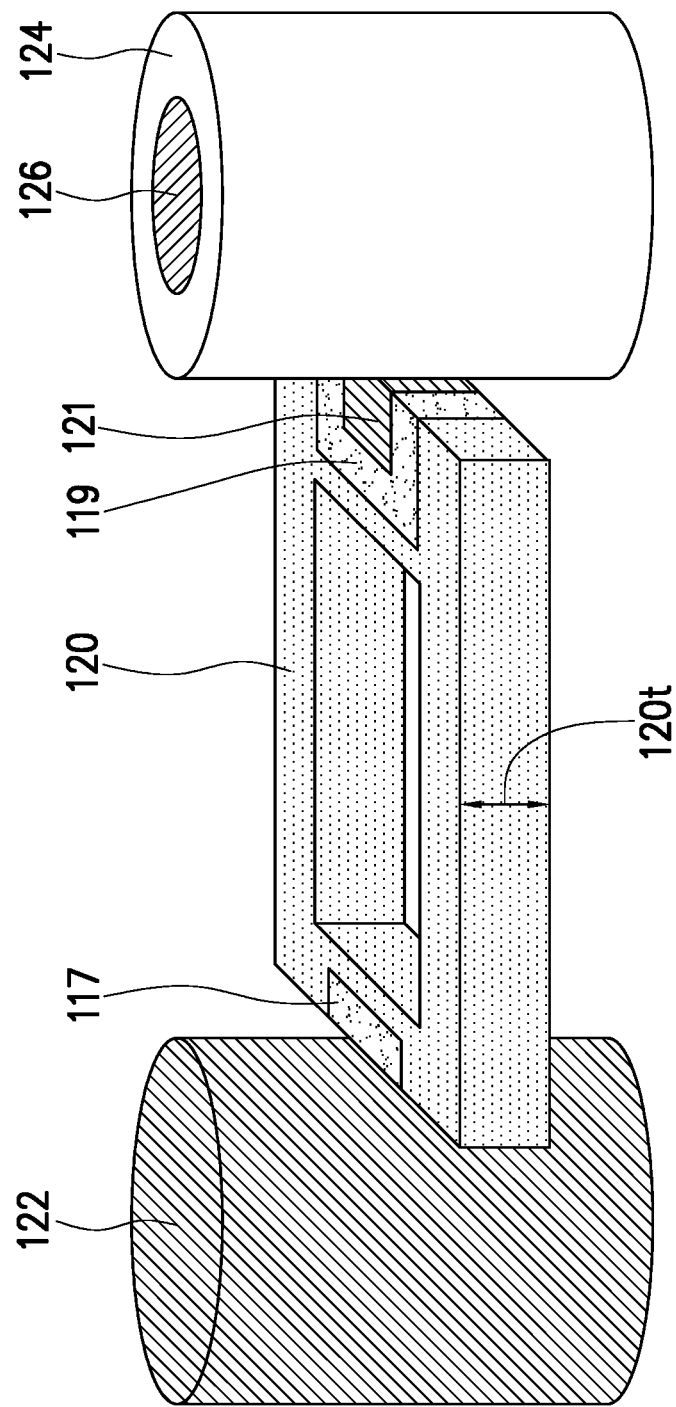
FIG. 3 is a three-dimensional schematic view of the memory cell of FIG. 1S.

FIG. 3 is a three-dimensional schematic view of the memory cell of FIG. 1S.

As shown in FIG. 3, the embodiment of the present invention can increase a current of the memory cell MC by increasing a thickness 120t of the channel layer 120 in the vertical direction. In other words, the current of the memory cell MC increases as the thickness 120t of the channel layer 120 becomes thicker. In the case, the embodiment of the present invention can effectively utilize the area of the chip in the horizontal direction to increase the integration density of the memory device 1, thereby facilitating the miniaturization of the chip. In addition, the electrode layer 121 may not be embedded in the second contact layer 119, but is arranged between the switching layer 124 and the channel layer 120 and between the switching layer 124 and the second contact layer 119, as shown in FIG. 3.

Figure 4:
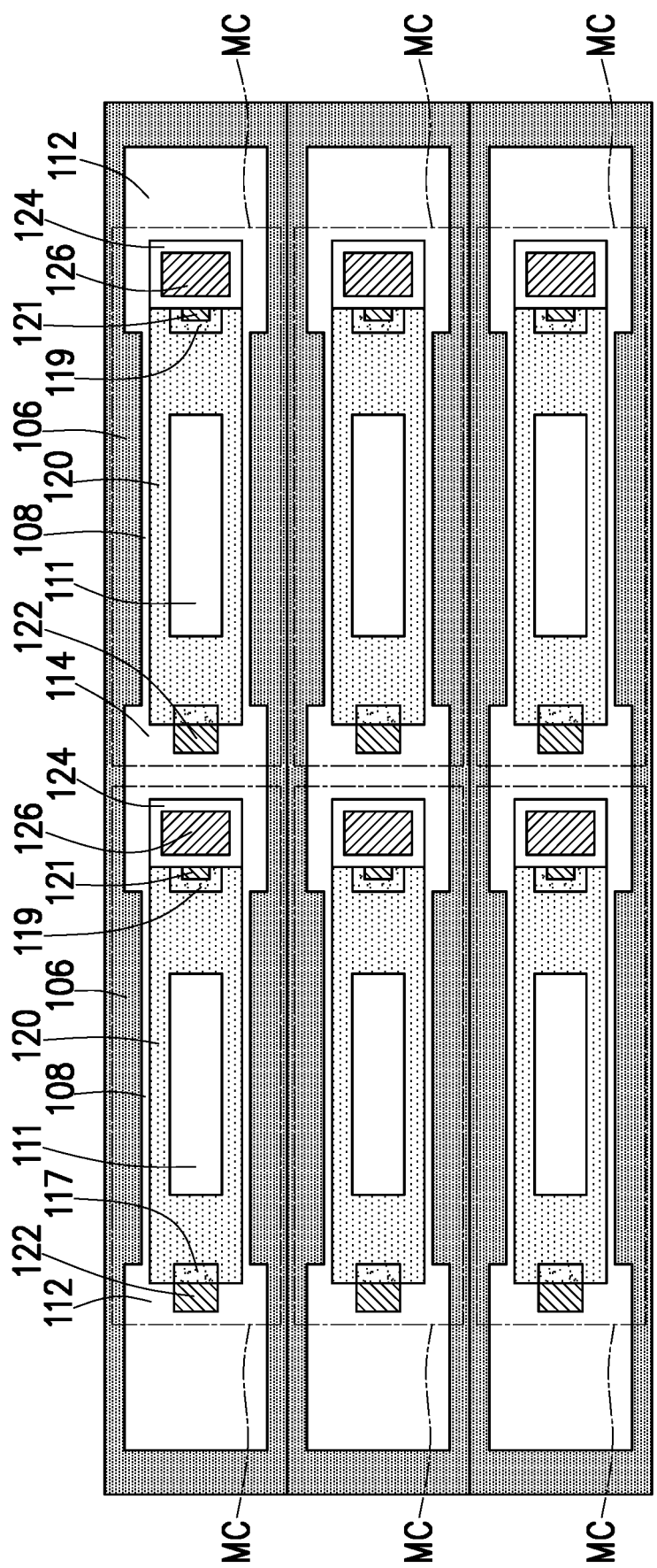
FIG. 4 is a schematic cross-sectional view of a memory cell according to a second embodiment of the invention.

FIG. 4 is a schematic cross-sectional view of a memory cell according to a second embodiment of the invention.

As shown in FIG. 4, in a memory device 2 of the second embodiment, the conductive layer 106 (i.e., gate or word line) horizontally surrounds the plurality of memory cells MC, so that the memory cells MC share the same gate voltage. In the case, the routing layout of the gate disposed at the same level can be simplified to reduce the manufacturing steps and manufacturing costs of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
    a stack structure, having a plurality of dielectric layers and a plurality of conductive layers stacked alternately;
    a plurality of channel layers, respectively embedded in the plurality of conductive layers, and alternately stacked with the plurality of dielectric layers;
    a source line, penetrating through the stack structure to be electrically connected to the plurality of channel layers at first sides of the plurality of channel layers;
    a bit line, penetrating through the stack structure to be coupled to the plurality of channel layers at second sides of the plurality of channel layers;
    a switching layer, wrapping the bit line to contact the plurality of channel layers at the second sides of the plurality of channel layers; and
    a dielectric pillar, penetrating through the plurality of channel layers to divide each channel layer into a doughnut shape.

2. The memory device according to claim 1, where the switching layer comprises more than one layer.

3. The memory device according to claim 1, where the bit line comprises more than one layer.

4. The memory device according to claim 1, further comprising:
    a gate dielectric layer, disposed between the plurality of conductive layers and the plurality of channel layers;
    a plurality of first contact layers, respectively embedded within the first sides of the plurality of channel layers to contact the source line;
    a plurality of second contact layers, respectively embedded within the second sides of the plurality of channel layers to contact the switching layer; and
    a plurality of electrode layers, respectively embedded in the plurality of second contact layers to contact the switching layer.

5. The memory device according to claim 4, wherein the plurality of first contact layers and the plurality of second contact layers have the same conductivity type, and the plurality of channel layers and the plurality of first contact layers have different conductivity types.

6. The memory device according to claim 1, wherein the plurality of channel layers and the plurality of conductive layers have the same conductivity type, and the plurality of channel layers have a doping concentration less than a doping concentration of the plurality of conductive layers.

7. The memory device according to claim 1, wherein a material of the switching layer comprises a variable resistance material, a phase change material, a ferroelectric material, a capacitive material, or a combination thereof.

8. The memory device according to claim 1, wherein a material of the plurality of channel layers comprises polysilicon, epitaxial silicon, indium-gallium-zinc oxide (IGZO), or a combination thereof.

9. The memory device according to claim 1, wherein a memory cell includes one of the plurality of channel layers, a portion of the source line coupling thereto, and a portion of the bit line coupling thereto, and one of the plurality of conductive layers horizontally surrounds a plurality of memory cells to share the same gate voltage onto the plurality of memory cells.

10. The memory device according to claim 1, wherein each channel layer and a corresponding conductive layer have the same height.

11. The memory device according to claim 1, wherein the switching layer does not wrap the source line.

12. A method of manufacturing a memory device, comprising:
    forming a stack structure having a plurality of dielectric layers and a plurality of conductive layers stacked alternately;
    forming a first opening in the stack structure to penetrate the stack structure;
    laterally recessing the plurality of conductive layers exposed by the first opening to form a plurality of first recesses;
    forming a gate dielectric layer on sidewalls of the plurality of conductive layers exposed by the plurality of first recesses;
    respectively forming a plurality of channel layers in the plurality of first recesses;
    forming a dielectric pillar in the first opening to contact the plurality of channel layers;
    forming a source line penetrating the stack structure at first sides of the plurality of channel layers;
    forming a bit line penetrating the stack structure at second sides of the plurality of channel layers; and
    forming a switching layer wrapping the bit line.

13. The method of manufacturing the memory device according to claim 12, wherein before forming the source line, the method further comprises:
    forming a second opening penetrating the stack structure at the first sides of the plurality of channel layers;
    forming a third opening penetrating the stack structure at the second sides of the plurality of channel layers;
    laterally recessing the plurality of channel layers exposed by the second opening to form a plurality of second recesses;
    laterally recessing the plurality of channel layers exposed by the third opening to form a plurality of third recesses;
    respectively forming a plurality of first contact layers in the plurality of second recesses; and
    respectively forming a plurality of second contact layers in the plurality of third recesses.

14. The method of manufacturing the memory device according to claim 13 wherein the plurality of first contact layers and the plurality of second contact layers are formed in the same step.

15. The method of manufacturing the memory device according to claim 13, wherein after forming the plurality of first and second contact layers, the method further comprises:

forming a fourth opening penetrating through the stack structure at outer sides of the plurality of second contact layers;

laterally recessing the plurality of second contact layers exposed by the fourth opening to form a plurality of fourth recesses; and respectively forming a plurality of electrode layers in the plurality of fourth recesses.

16. The method of manufacturing the memory device according to claim 15, wherein after forming the plurality of electrode layers, the method further comprises:

forming a fifth opening penetrating through the stack structure at outer sides of the plurality of first contact layers; and filling a source line material in the fifth opening to form the source line contacting the plurality of first contact layers.

17. The method of manufacturing the memory device according to claim 16, wherein after forming the source line, the method further comprises:

forming a sixth opening penetrating through the stack structure at outer sides of the plurality of electrode layers;

forming the switching layer on a sidewall of the sixth opening to contact the plurality of electrode layers; and filling a bit line material in the sixth opening, so that the bit line is wrapped by the switching layer.

18. The method of manufacturing the memory device according to claim 12, wherein after forming the dielectric pillar, the method further comprises:

respectively forming isolation structures penetrating through the stack structure at the first and second sides of the plurality of channel layers, wherein the source line and the bit line are disposed in the isolation structures.

19. The method of manufacturing the memory device according to claim 12, wherein a material of the switching layer comprises a variable resistance material, a phase change material, a ferroelectric material, a capacitive material, or a combination thereof.

20. The method of manufacturing the memory device according to claim 12, wherein a material of the plurality of channel layers comprises polysilicon, epitaxial silicon, indium-gallium-zinc oxide (IGZO), or a combination thereof.

* * * * *